United States Patent [19]
Suzuki et al.

[11] Patent Number: 6,157,335
[45] Date of Patent: Dec. 5, 2000

[54] VOLTAGE GENERATING CIRCUIT

[75] Inventors: Hisao Suzuki; Norikazu Fushimi, both of Kasugai, Japan

[73] Assignee: Fujitus Limited, Kawasaki, Japan

[21] Appl. No.: 09/126,090

[22] Filed: Jul. 30, 1998

[30] Foreign Application Priority Data

Jan. 30, 1998 [JP] Japan .................................. 10-019006

[51] Int. Cl.⁷ .................................................. H03M 1/78
[52] U.S. Cl. ........................... 341/154; 341/156; 341/144
[58] Field of Search ..................................... 341/156, 144, 341/154, 145, 152

[56] References Cited

U.S. PATENT DOCUMENTS 5,111,205  5/1992  Morlon ..................................... 341/156
5,619,203  4/1997  Gross, Jr. et al. ....................... 341/144

FOREIGN PATENT DOCUMENTS 0 661 817 A1  7/1995  European Pat. Off. .

OTHER PUBLICATIONS

Database Inspec Institute of Electrical Engineers, Stevenage, GB Inspec No. 913190, Bydzovsky J: "A digital–analogue convertor with a weighting potentiometer" XP002082939; & Sdelovaci Technika, Jan. 1976, Czechoslovakia, vol. 24, No. 1, ISSN, 0036–9942.

Primary Examiner—Brian Young
Assistant Examiner—John Nguyen
Attorney, Agent, or Firm—Armstrong, Westerman, Hattori, McLeland & Naughton

[57] ABSTRACT

A voltage generating circuit for a digital to analog converter divides a potential difference between a high potential supply and a low potential supply. The voltage generating circuit includes a voltage dividing circuit having three impedance elements connected in series between the high potential supply and the low potential supply. A first current source is connected to a node between the first two series connected impedance elements and a second current source is connected to a node between the second and third series connected impedance elements. The first and second current source supply first and second currents having the same value to the first and second nodes, respectively. A control circuit compares a reference voltage with a selected voltage output from the voltage dividing circuit and controls the first and second currents supplied by the first and second current source so that the selected voltage is made equal to the reference voltage.

19 Claims, 17 Drawing Sheets

|  | SW9a (V1) | SW9a (V2) | SW9a (V3) |
|---|---|---|---|
| SW1 | $\frac{24}{32} V_{DD}$ | $\frac{16}{32} V_{DD}$ | $\frac{8}{32} V_{DD}$ |
| SW2 | $\frac{25}{32} V_{DD}$ | $\frac{17}{32} V_{DD}$ | $\frac{9}{32} V_{DD}$ |
| SW3 | $\frac{26}{32} V_{DD}$ | $\frac{18}{32} V_{DD}$ | $\frac{10}{32} V_{DD}$ |
| ⋮ | ⋮ | ⋮ | ⋮ |
| SW8 | $\frac{31}{32} V_{DD}$ | $\frac{23}{32} V_{DD}$ | $\frac{15}{32} V_{DD}$ |

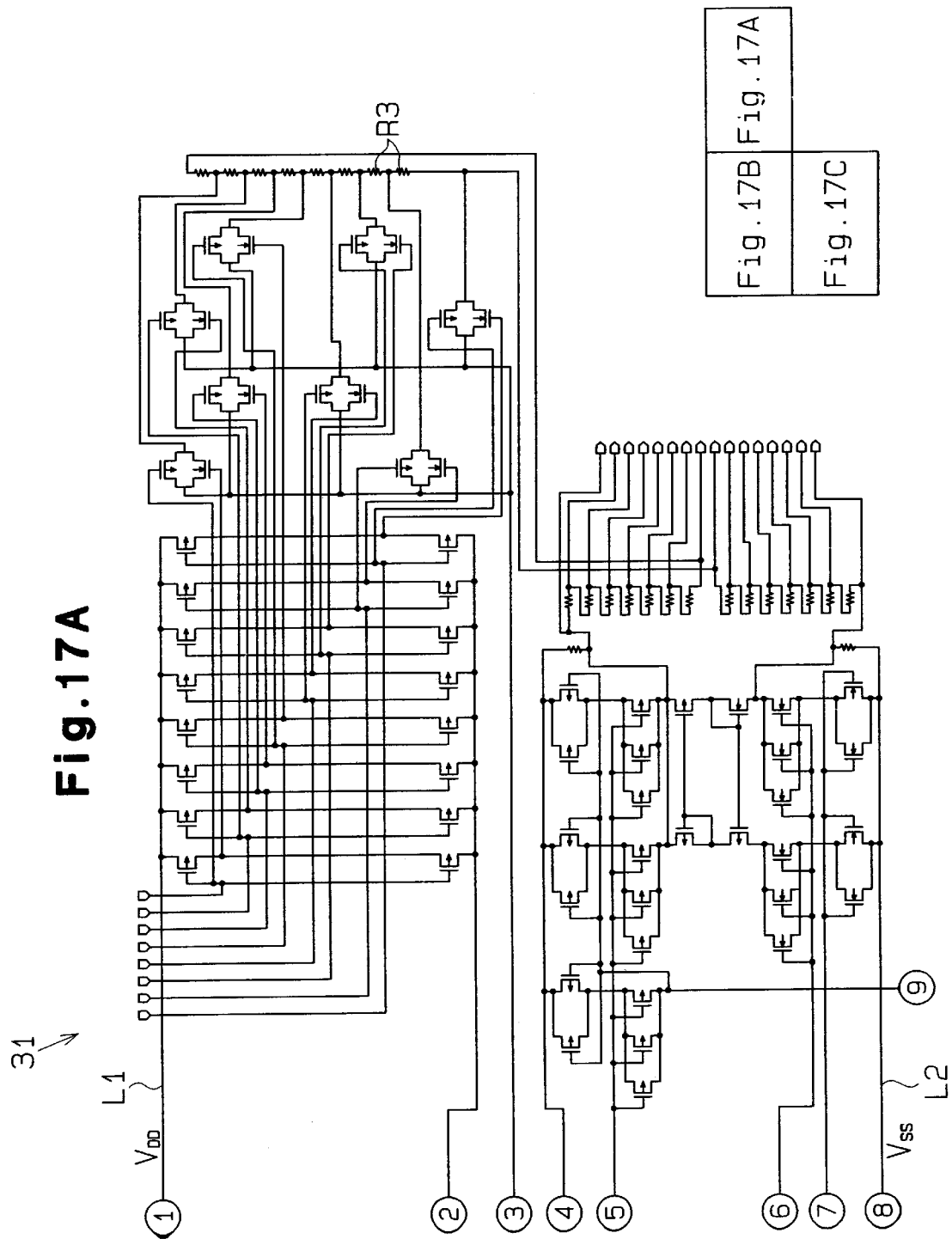

VOLTAGE GENERATING CIRCUIT

BACKGROUND OF THE INVENTION

The present invention relates to a voltage generating circuit that divides a potential difference between a higher potential supply and a lower potential supply to generate divided potentials, and more specifically, to a voltage generating circuit integrated into a D/A converter and a current generating circuit.

FIG. 1 is a circuit diagram of a digital-to-analog (D/A) converter 11 having a resistor string configuration which is incorporated into a semiconductor device. The D/A converter 11 divides a potential difference between a higher potential supply VDD and a lower potential supply VSS into 64 equal potentials, and generates an analog signal Aout having a potential [(VDD−VSS)×(n/64)+VSS] corresponding to a digital signal Din. The D/A converter 11 includes a voltage dividing circuit 12 having resistors R1–R11 whose number corresponds to the 6 bit digital signal Din. The resistors R1–R11 are connected in series between a first supply line L1 for the higher potential supply VDD and a second supply line L2 for the lower potential supply VSS. The values of the resistors R1–R11 are weighted in correspondence with the bit number of the digital signal Din.

Provided that the resistor R1 has the reference resistance '1', the resistors R2a, R2b are set to have the resistance '1', the resistors R3a, R3b to have the resistance '2', the resistors R4a, R4b to have the resistance '4', and the resistors R5–R11 to have the resistance '8'.

The resistors R2a–R4a on the higher potential supply VDD are connected in parallel with switches SW1a–SW3a, respectively. The resistors R2b–R4b on the lower potential supply VSS are connected in parallel with switches SW1b–SW3b, respectively. The D/A converter 11 controls the switches SW1a–SW3a and SW1b–SW3b to turn on or off in accordance with the lower three bits of the digital signal Din. If the lower three bits are '000', for example, the D/A converter 11 switches the switches SW1b–SW3b off and the switches SW1a–SW3a on. This sets the resistance between a node N2 and the second supply line L2 to '0' (the resistance between the first supply line L1 and a node N1 is set to '8'). If the lower three bits of the digital signal Din are '001', the D/A converter 11 switches the switches SW1b, SW2b, and SW3a off and the switches SW1a, SW2a, and SW3b on. This sets the resistance between the node N2 and the second supply line L2 to '1' (the resistance between the first supply line L1 and the node N1 is set to '7').

The combined resistance of the resistors R5–R11 connected in series is always constant (8×7=56). The D/A converter 11 holds the resistance between the first supply line L1 and the second supply line L2 always at a constant value '64' by controlling the switches. Further, in accordance with the lower three bits of the digital signal Din, the D/A converter 11 varies the resistance between the first supply line L1 and the node N1 and the resistance between the node N2 and the second supply line L2 in a '1' by '1' manner.

The potential difference between the node N1 and the node N2 is determined by the potential difference between the first supply line L1 and the second supply line L2, the resistance between the first supply line L1 and the node N1, the resistance between the nodes N1 and N2, and the resistance between the node N2 and the second supply line L2. Accordingly, the D/A converter 11 varies the potential difference between the node N1 and N2 in steps of 1/64 of the potential difference between the first supply line L1 and the second supply line L2, in accordance with the lower three bits of the digital signal Din. The potential difference between the node N1 and N2 is equally divided by the resistors R5–R11 into a plurality of (in this case 8) divided potentials. The D/A converter 11 switches one of the switches SW4–SW11 on in accordance with the upper three bits of the digital signal Din. The one divided potential thus generated is supplied to an amplifier 13 through the switch SW4–SW11 that is on. The amplifier 13 outputs the analog signal Aout.

The noninverting input terminal of the amplifier 13 is connected to the lower potential supply VSS through a capacitor C1. The capacitor C1 is provided to reduce noise generated during the switching of the switches SW4–SW11.

The switch SW1a connected in parallel with the resistor R2a includes, as shown in FIG. 2, a P-channel MOS (PMOS) transistor 14 and an N-channel MOS (NMOS) transistor 15, which are connected in parallel each other. The gate of the PMOS transistor 14 is supplied with a control signal Cont that is inverted by an inverter 16. The gate of the NMOS transistor 15 is supplied with the control signal Cont. Both the transistors 14, 15 simultaneously switch on or off in response to the control signal Cont. The other switches SW1b, SW2a–SW3b have the same configuration as the switch SW1a.

However, the resistance of each of the switches SW1a–SW3b when turned on is not zero ohms. Consequently, the resistors R2a–R4b are each connected in parallel with the resistances of the switches SW1a–SW3b when turned on. As the result, the potential difference between the node N1 and the node N2 varies. This variation makes it difficult to obtain an accurate analog potential having 64 discrete values, consequently making the operation of the semiconductor device unstable.

The semiconductor device is provided with a current generating circuit for supplying a predetermined current to its inner circuits. It is difficult to obtain a stabilized current due to the variation of the power supply voltage supplied to the current generating circuit. This also adversely affects the operation of the semiconductor device.

It is therefore an object of the present invention to provide a D/A converter and a current generating circuit which overcome those difficulties and allow for stable operation of the semiconductor device.

SUMMARY OF THE INVENTION

Briefly stated, the present invention provides a voltage generating circuit including a voltage dividing circuit and first and second current sources. The voltage dividing circuit includes a first impedance element connected to a first supply line, a second impedance element connected to a second supply line and a third impedance element connected between the first and second impedance elements, having a predetermined impedance. The second impedance element has substantially the same impedance as the first impedance element. Voltages based on the impedances of the first to third impedance elements are generated at a first node between the first and third impedance elements and at a second node between the second and third impedance elements. The first current source and the second current source are connected to the first node and the second node, respectively and supply currents having substantially the same value to the first and second nodes, respectively.

The present invention also provides a digital-to-analog conversion circuit including a voltage dividing circuit, first and second current sources, a selecting unit and a control circuit. The voltage dividing circuit includes a first impedance element connected to a first supply line, a second impedance element connected to a second supply line, and a third impedance element connected between the first and second impedance elements, having a predetermined impedance. The second impedance element haa substantially the same impedance as the first impedance element. The third impedance element includes a plurality of sub-impedance elements for dividing a voltage between the first and second impedance elements to generate a plurality of divided voltages at nodes between the sub-impedance elements. The first current source is connected to a first node between the first and third impedance elements and a second current source connected to a second node between the second and third impedance elements. The first and second current sources supply first and second currents having substantially identical values to the first and second nodes, respectively. The selecting unit selects one of the nodes between the sub-impedance elements and outputs the node voltage as a selected voltage on the basis of the first and second currents and the impedances of the first to third impedance elements. The control circuit receives the selected voltage and a predetermined reference voltage, compares the selected voltage with the predetermined reference voltage, and, on the basis of the compared result, controls the first and second currents supplied from the first and second current sources to bring the selected voltage to a substantial equivalence with the reference voltage. The first and second node voltages are used for generating an analog voltage signal.

The present invention provides a constant current circuit including first and second transistors, an output transistor and a control circuit. The first and second transistors are connected in parallel between first and second supply lines, which have gates connected with each other. The first and second transistors are different sizes. The output transistor has a gate connected to the gates of the first and second transistors. The control circuit controls the voltage applied to the gates of the first and second transistors so that drain currents having substantially the same value flow through the first and second transistors. The drain current of the output transistor is constant.

The present invention provides a digital-to-analog conversion circuit including a voltage dividing circuit, first and second current sources and a selecting unit a first control circuit. The voltage dividing circuit includes a first impedance element connected to a first supply line, a second impedance element connected to a second supply line and a third impedance element connected between the first and second impedance elements. The second impedance element has substantially the same impedance as the first impedance element. The third impedance element has a predetermined impedance. The third impedance element includes a plurality of sub-impedance elements for dividing a voltage between the first and second impedance elements to generate a plurality of divided voltages at nodes between the sub-impedance elements. The first current source is connected to a first node between the first and third impedance elements, and a second current source is connected to a second node between the second and third impedance elements, which supply first and second currents having substantially the same value to the first node and the second node, respectively. The selecting unit selects one of the nodes between the sub-impedance elements and outputs the selected node voltage as a selected voltage on the basis of the first and second currents and the impedances of the first through third impedance elements. The first control circuit includes a comparing circuit that receives the selected voltage and a predetermined reference voltage and compares the selected voltage with the predetermined reference voltage. The first control circuit controls, on the basis of the compared result, the first and second currents supplied from the first and second current sources so as to bring the selected voltage to a substantial equivalence with the reference voltage. Voltages at the first and second nodes are used for generating an analog voltage signal. The comparing circuit includes a constant current circuit for generating a bias current used in the comparing circuit. The constant current circuit includes first and second transistors connected in parallel between the first and second supply lines. The gates of the first and second transistors are connected to each other. The first and second transistors have different sizes. An output transistor having a gate is connected to the gates of the first and second transistors. A second control circuit controls voltages applied to the gates of the first and second transistors so that drain currents having a substantially same value flow through the first and second transistors. The drain current flows through the output transistor as the bias current.

The present invention also provides a current generating circuit including a first voltage dividing circuit, a second voltage dividing circuit, first and second current sources, a differential circuit and a third current source. The first voltage dividing circuit is connected between first and second supply lines, which divides a differential voltage between first and second voltages to generate a first divided voltage. The second voltage dividing circuit includes a first impedance element connected to the first supply line, a second impedance element connected to the second supply line and a third impedance element connected between the first and second impedance elements. a second impedance element has substantially the same impedance as the first impedance element. The third impedance element has a predetermined impedance. The third impedance element includes a plurality of sub-impedance elements for generating a plurality of second divided voltages at nodes between the sub-impedance elements. The first current source is connected to a first node between the first and third impedance elements and a second current source connected to a second node between the second and third impedance elements, which supply a first current and a second current having substantially the same value to the first node and the second node, respectively. The differential circuit receives the first divided voltage and one of the plurality of the second divided voltages and controls the first and second currents supplied from the first and second current sources so as to bring the first divided voltage to a substantial equivalence with the selected second divided voltage. The third current source is connected to the differential circuit which generates a third current having a value substantially equal to the first and second currents. The third current is an output current of the current generating circuit.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 17A–FIG. 17C are more detailed circuit diagrams of the D/A converter in FIG. 8;

DETAILED DESCRIPTION OF THE PREFERRED EMBODIMENTS

Figure 1:
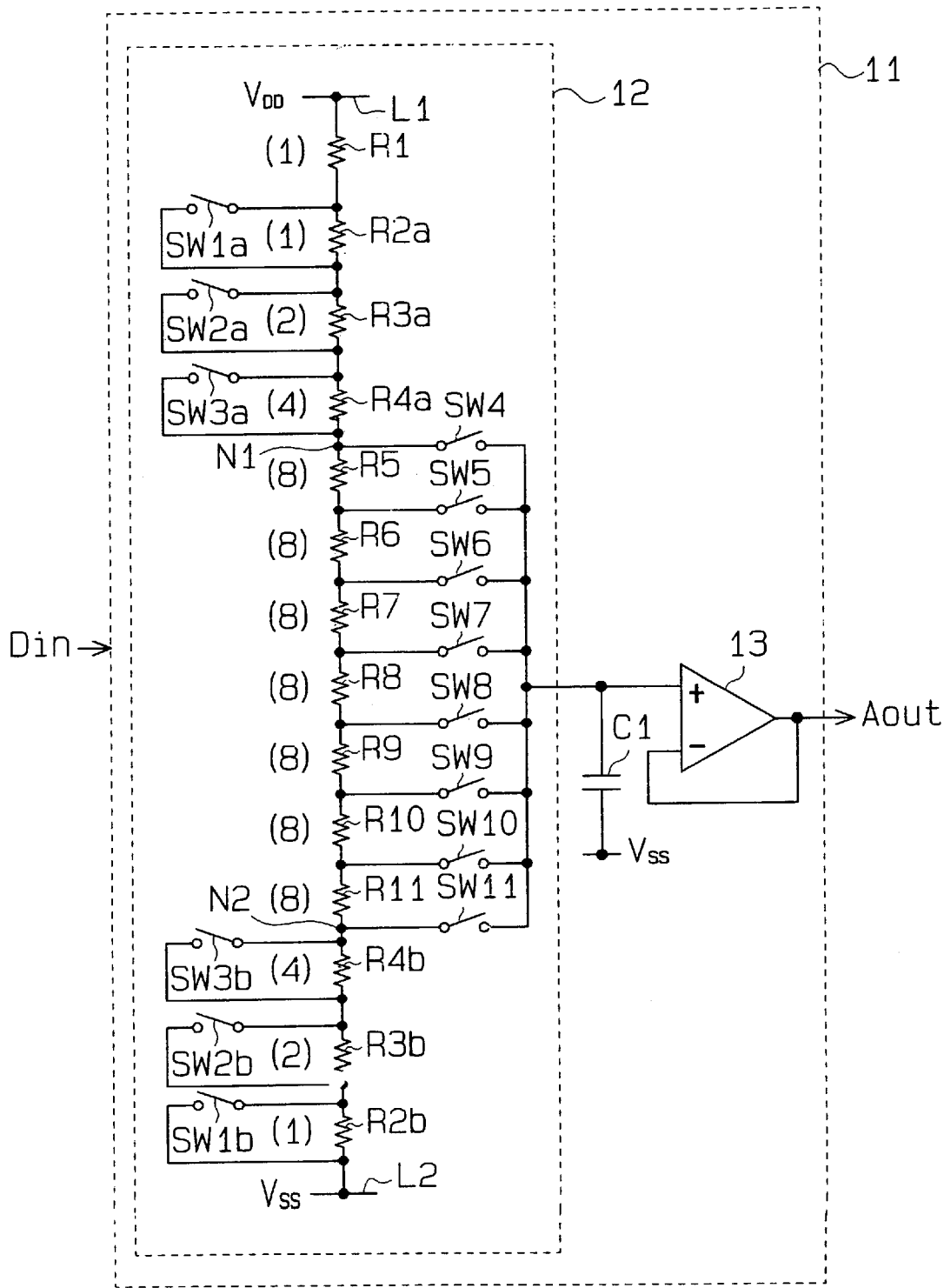
FIG. 1 is a circuit diagram of a conventional D/A converter.
Figure 2:
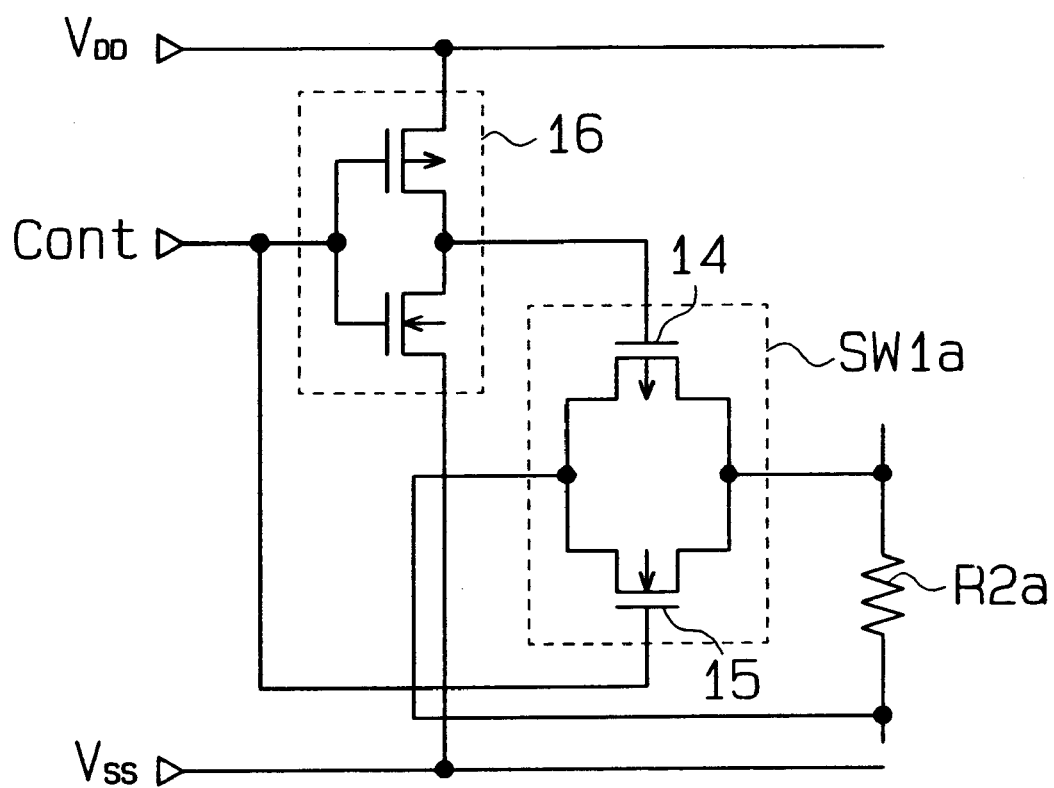
FIG. 2 is a circuit diagram of a switch relating to the D/A converter in FIG. 1.
Figure 3:
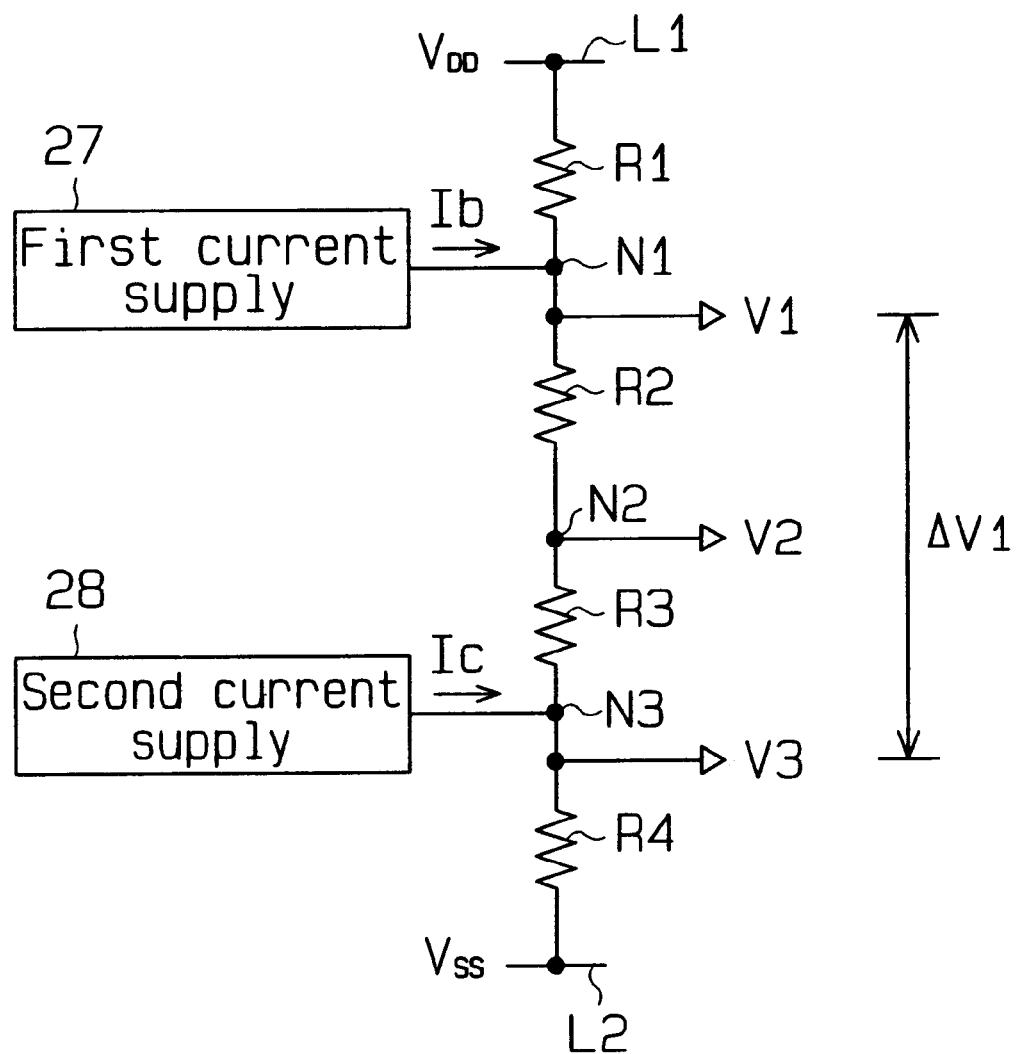
FIG. 3 is a schematic circuit diagram of a voltage generating circuit of the present invention.

FIG. 3 is a schematic circuit diagram of a voltage generating circuit of the present invention. The voltage generating circuit contains first and second impedance elements R1, R4 preferably having substantially the same impedance. The first impedance element R1 is connected to a first supply line L1 of a higher potential supply VDD, and the second impedance element R4 is connected to a second supply line L2 of a lower potential supply VSS. Between the first and second impedance elements R1, R4 are connected third and fourth impedance elements R2, R3 in series. A first current supply 27 is connected to a first node N1 between the first and third impedance elements R1, R2. A second current supply 28 is connected to a second node N3 between the second and fourth impedance elements R4, R3. The first and second current supplies 27, 28 each supply A substantially identical currents Ib, Ic to the first and second nodes N1, N3, respectively.

Figure 4:
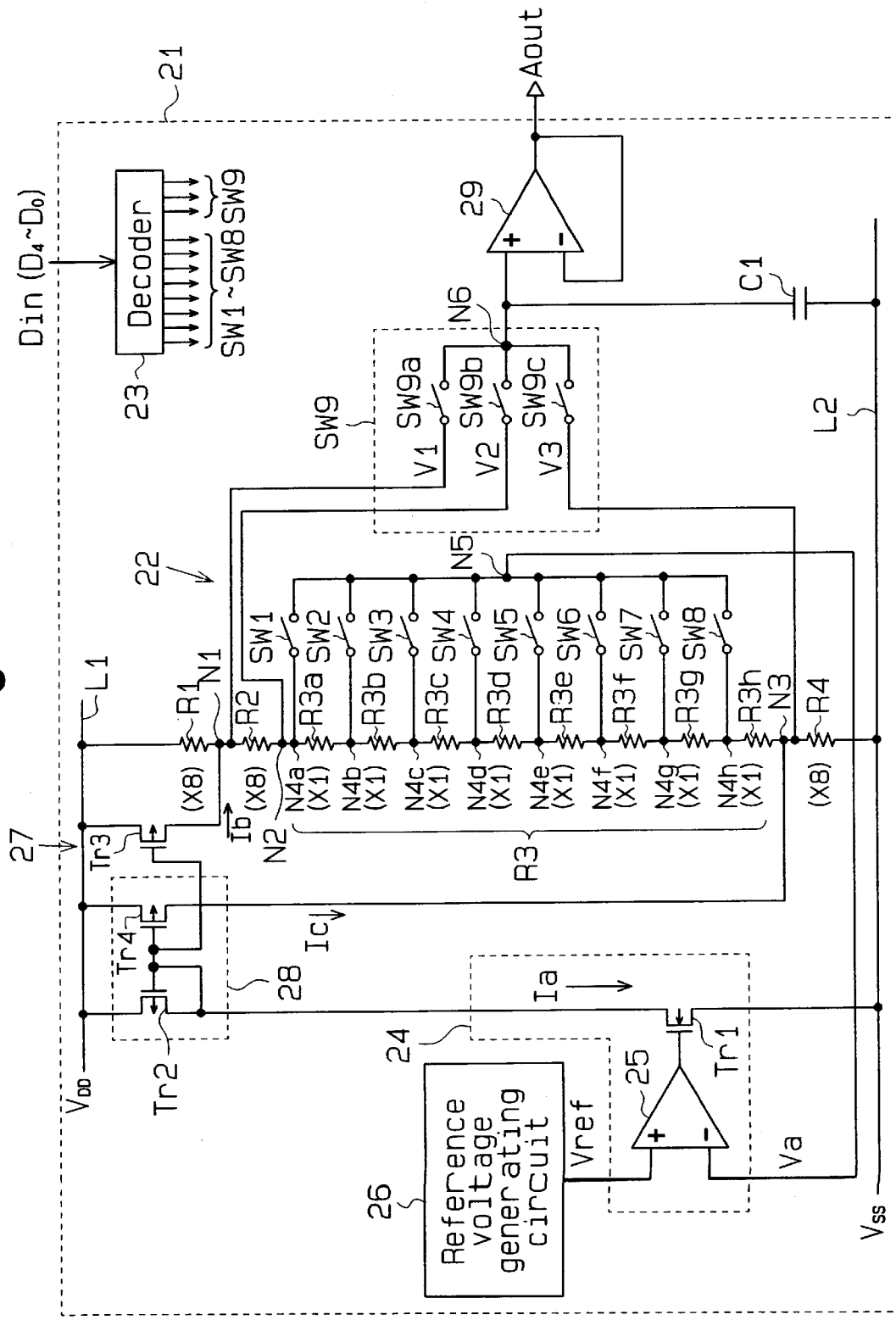
FIG. 4 is a circuit diagram of a D/A converter relating to a first embodiment of the present invention.

FIG. 4 is a circuit diagram of a D/A converter 21 relating to a first embodiment of the present invention. The D/A converter 21 is provided with a voltage dividing circuit 22 which is connected between the first supply line L1 of the higher potential supply VDD and the second supply line L2 of the lower potential supply VSS. The voltage dividing circuit 22 includes resistors R1, R2, R3 consisting of R3a–R3h, and R4, all of which are connected in series between the first supply line L1 and the second supply line L2. The first resistor R1 and the fourth resistor R4 preferably have substantially the same impedance.

The second resistor R2 and the third resistor R3 preferably have substantially the same impedance. The potential difference between a terminal (node N1) located at the lower potential side of the first resistor R1 and a terminal (node N3) located at the higher potential side of the fourth resistor R4 is divided into two equal potentials by the second and third resistors R2, R3. A first potential difference between a divided potential V1 at the node N1 and a divided potential V2 at the node N2 is substantially equal to a second potential difference between the divided potential V2 at the node N2 and a divided potential V3 at the node N3.

That is, each of the first through fourth resistors R1–R4 has a substantially the same impedance. Therefore, each of the divided potentials V1–V3 at the nodes N1–N3 is equal to the potential difference between the higher potential supply VDD and the lower potential supply VSS divided by four.

Each of the eight resistors R3a–R3h constituting the third resistor R3 has an identical impedance. Therefore, the potential difference between the opposing ends of the third resistor R3 (i.e., the node N2 and the node N3) is divided into eight equal potentials. The terminals of the eight resistors R3a–R3h at the higher potential supply VDD side are each connected to the first terminals of eight switches SW1–SW8. The second terminals of the eight switches SW1–SW8 are connected commonly to a node N5. The common node N5 is connected to a first control circuit 24 which includes a first differential amplifier 25. The switches SW1–SW8 are turned on or off by control signals output from a decoder 23.

The decoder 23 receives a digital signal Din (D4–D0) comprising a plurality of bits (five bits in this embodiment) from an external circuit (not illustrated), and generates the control signals for controlling the switches SW1–SW8. The decoder 23 decodes the lower three bits (D2–D0) of the digital signal Din, and generates the control signal to turn one of the switches SW1–SW8 on. In response to the control signal, one of the eight switches is turned on, so that one of nodes N4a–N4h of the voltage dividing circuit 22 is connected to the inverting input terminal of the first differential amplifier 25. Thus, a selected potential Va is supplied to the first differential amplifier 25. The selected potential Va is one of the potentials obtained by dividing the potential difference between the node N2 and the node N3 by the resistors R3a–R3h into eight equal parts.

The noninverting input terminal of the first differential amplifier 25 is connected to a reference voltage generating circuit 26. The noninverting input terminal receives a predetermined reference potential Vref from the reference voltage generating circuit 26.

Figures 5, 6:
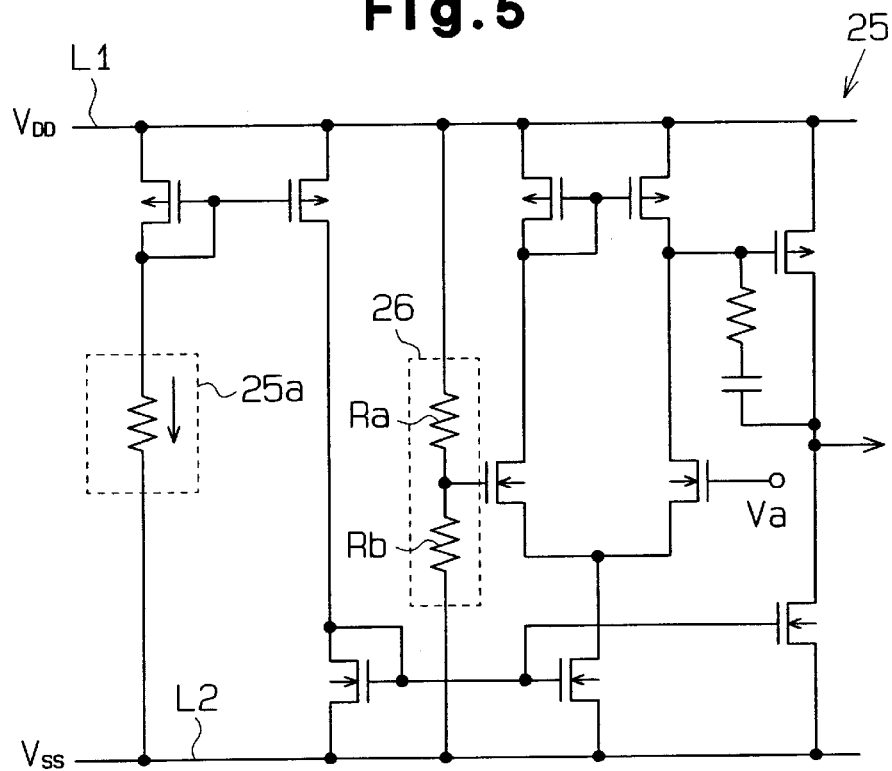
FIG. 5 is a circuit diagram of a deferential amplifier of the D/A converter in FIG. 4.
FIG. 6 is a chart to explain the operation of the D/A converter in FIG. 4.

As shown in FIG. 5, the reference voltage generating circuit 26 includes resistors Ra and Rb, which are connected in series between the supply line L1 for the higher potential supply VDD and the supply line L2 for the lower potential supply VSS. Preferably, the resistors Ra and Rb have the same impedance. The reference voltage generating circuit 26 generates the reference potential Vref by dividing the potential difference between the higher potential supply VDD and the lower potential supply VSS by two.

Referring again to FIG. 4, the output terminal of the first differential amplifier 25 is connected to the gate of a first transistor Tr1, which is preferably an N-channel MOS transistor. The first differential amplifier 25 controls the gate voltage of the first transistor Tr1 on the basis of the potential difference between the reference potential Vref and the selected potential Va. Therefore, a current Ia corresponding to the gate voltage flows through the first transistor Tr1.

The source of the first transistor Tr1 is connected to the second supply line L2, and the drain is connected to the drain of a second transistor Tr2, which is preferably a P-channel MOS transistor. The source of the second transistor Tr2 is connected to the first supply line L1. The gate of the second transistor Tr2 is connected to its drain and the gates of a third transistor Tr3 and a fourth transistor Tr4. Preferably, third and fourth transistors Tr3 and Tr4 are a P-channel MOS transistors. The source of the third transistor Tr3 is connected to the first supply line L1, and the drain is connected to the node N1 of the voltage dividing circuit 22. The source of the fourth transistor Tr4 is connected to the first supply line L1, and the drain is connected to the node N3 of the voltage dividing circuit 22.

The second transistor Tr2 and the third transistor Tr3 form a current mirror circuit used as the first current source 27. The second transistor Tr2 and the fourth transistor Tr4 form a current mirror circuit used as a second current source 28. The first and second current sources 27, 28 share the second transistor Tr2. The first current source 27 and the second current source 28 generate currents Ib and Ic, respectively, which have the same current value as the current flowing through the second transistor Tr2 (namely, the current Ia flowing through the first transistor Tr1 controlled by the first differential amplifier 25). The first current source 27 supplies the current Ib to the node N1. The second current source 28 supplies the current Ic to the node N3. The current Ic has the same current value as the current Ib. Thus, the first control circuit 24 including the first differential amplifier 25 controls the values of the currents Ib and Ic.

The voltage dividing circuit 22 is provided with a switch SW9 including three switches SW9a–SW9c, which have first terminals respectively connected to the node N1–N3 and second terminals connected to a common node N6. The switches SW9a–SW9c are used to select one of the divided potentials V1–V3. The common node N6 is connected to the noninverting input terminal of a second amplifier 29.

The switches SW9a–SW9c switch on or off in response to the control signals generated by the decoder 23 in accordance with the upper two bits D4, D3 of the digital signal Din. Thus, when one of the switches SW9a–SW9c is specified by the decoder 23 to be turned on, one of the nodes N1–N3 is selected. The potential of the one selected node appears at the node N6.

The output terminal of the second amplifier 29 is fed back via its inverting input terminal. Therefore, the second amplifier 29 operates as a buffer that outputs the analog signal Aout having the potential of the node N6. The noninverting input terminal of the second amplifier 29 is connected to the supply line L2 through a capacitor C1. The capacitor C1 operates yo reduce noise generated when the switches SW9a–SW9c are switched on or off.

The operation of the D/A converter 21 will now be described with reference to FIG. 3 and FIG. 4.

In a first case, the first and second current sources 27, 28 output the currents Ib, Ic being 0A.

In the first case, currents I1$a$, I2$a$, I3$a$ and I4$a$ through the resistors R1–R4 are given by:

$$I1a=I2a=I3a=I4a=(VDD-VSS)/(R1+R2+R3+R4).$$

The currents through the resistors R1–R4 is expressed by Iref. The divided potentials V1$a$–V3$a$ at the nodes N1–N3 are given by:

$$V1a = I2a \cdot R2 + I3a \cdot R3 + I4a \cdot R4$$
$$= Iref \cdot (R2 + R3 + R4)$$
$$V2a = I3a \cdot R3 + I4a \cdot R4$$
$$= Iref \cdot (R3 + R4)$$
$$V3a = I4a \cdot R4$$
$$= Iref \cdot R4.$$

Therefore, provided that the potential difference $\Delta V1a$ between the node N1 and the node N3 is given by the following.

$$\Delta V1a = V1a - V3a$$
$$= Iref \cdot (R2 + R3 + R4) - Iref \cdot R4$$
$$= Iref \cdot (R2 + R3).$$

In a second case, the first and second current sources 27, 28 output the currents Ib, Ic having predetermined values.

In the second case, provided that the currents through the resistors R1–R4 are expressed by I1$b$, I2$b$, I3$b$, I4$b$, $$I1b=Iref-Ib$$

$$I2b=I1b+Ib=Iref$$

$$I3b=I2b=Iref$$

$$I4b=I3b+Ic=Iref+Ic.$$

Here, the first and second current sources 27, 28 output the currents Ib, Ic having the same value. That is, Ic=Ib. Therefore, the current I4$b$ through the resistor R4 is given as follows.

$$I4b=Iref+Ib$$

Accordingly, the divided potentials V1$b$–V3$b$ at the nodes N1–N3 are given by:

$$V1b = I2b \cdot R2 + I3b \cdot R3 + I4b \cdot R4$$
$$= Iref \cdot R2 + Iref \cdot R3 + (Iref + Ib) \cdot R4$$
$$= Iref \cdot (R2 + R3 + R4) + Ib \cdot R4$$
$$V2b = I3b \cdot R3 + I4b \cdot R4$$
$$= Iref \cdot R3 + (Iref + Ib) \cdot R4$$
$$= Iref \cdot (R3 + R4) + Ib \cdot R4$$
$$V3b = I4b \cdot R4$$
$$= (Iref + Ib) \cdot R4$$
$$= Iref \cdot R4 + Ib \cdot R4$$

Therefore, provided that the potential difference $\Delta V1b$ between the node N1 and the node N3 in this case is given by the following.

$$\Delta V1b = V1b - V3b$$
$$= \{Iref \cdot (R2 + R3 + R4) + Ib \cdot R4\} - (Iref \cdot R4 + Ib \cdot R4)$$
$$= Iref \cdot (R2 + R3)$$

Therefore, the differential potentials ΔV1a, ΔV1b in the above two cases have the same value, namely:

ΔV1a=ΔV1b.

This means that the potential difference between the node N1 and the node N3 is maintained at a constant value, regardless of the values of the currents Ib, Ic supplied from the first and second current sources 27, 28 (with the condition of Ib=Ic).

Each of the potentials V1b–V3b of the nodes N1–N3 when the current Ib is supplied is higher by the potential Ib R4 than each of the potentials V1a–V3a of the nodes N1–N3 when the current Ib is not supplied. Therefore, it is possible to appropriately vary the divided potentials V1–V3 at the nodes N1–N3 by appropriately selecting the values of the output currents Ib, Ic from the first and second current supply sources 27, 28, while holding the potential difference between the nodes N1 and N3 constant.

In the following discussion, the lower potential supply VSS is assumed to be zero volts, to facilitate the description. However, it will be understood by those of ordinary skill in the art the other voltage value may be provided by the lower potential supply Vss.

When the switch SW1, for example, switches on in response to the digital signal Din, the first differential amplifier 25 receives a divided potential at a node N4a as a selected potential Va.

This selected potential Va is given as follows.

Va=VDD·(R3+R4)/(R1+R2+R3+R4)

Here, the first and the fourth resistors R1, R4 have an identical impedance, and the second and the third resistors R2, R3 have an identical impedance. Therefore, the above selected potential Va becomes:

Va=VDD/2.

This selected potential Va is substantially coincident with the reference potential Vref (VDD/2). Therefore, the first differential amplifier 25 controls the gate of the first transistor Tr1 to turn the transistor Tr1 off. Accordingly, the current Ia of zero amps flows through the transistor Tr1, and the first and second current sources 27, 28 output the currents Ib, Ic of zero amps.

As a result, the divided potentials V1–V3 at the nodes N1–N3 are given by the following:

V1=VDD·(R2+R3+R4)/(R1+R2+R3+R4)

V2=VDD·(R3+R4)/(R1+R2+R3+R4)

V3=VDD·(R4)/(R1+R2+R3+R4).

Here, provided that the resistors R1–R4 are set to take on the resistance of '8', the above divided potentials V1–V3 are rendered as follows.

V1=VDD·24/32

V2=VDD·16/32

V3=VDD·8/32

When one of the switches SW9a–SW9c switches on in accordance with the upper two bits of the digital signal Din, one of the divided potentials V1–V3 is input to the second amplifier 29. The second amplifier 29 outputs the analog signal Aout in accordance with the divided potential input thereto.

Next, when the switch SW3 switches on in response to the digital signal Din, the first differential amplifier 25 receives a divided potential of a node N4c as a selected potential Va.

Here, provided that the resistors R1–R4 are set to take on the resistance of '8', and the resistors R3a–R3h are set to take on the resistance of '1', the above selected potential Va is represented as:

Va=VDD·14/32.

The first differential amplifier 25 controls the gate voltage of the first transistor Tr1 on the basis of the selected potential Va and the reference potential Vref so that a predetermined current Ia flows through the first transistor Tr1. The first and second current sources 27, 28 each supply the nodes N1, N3 with the currents Ib, Ic, respectively, which are the same value as the current Ia.

The potentials of the nodes N1–N3 increase when the currents Ib, Ic are supplied; however, the potential difference between the nodes N1 and N3 is held constant. Accordingly, the divided potential (namely, the selected potential Va) at the node N4c increases. The first differential amplifier 25 controls the gate voltage of the first transistor Tr1 so that the divided potential (the selected potential Va) at the node N4c coincides with the reference potential Vref. In other words, the first control circuit 24 controls the currents Ib, Ic supplied from the first and second current sources 27, 28 to the voltage dividing circuit 22 so that the divided potential at the node N4c coincides with the reference potential Vref.

At that moment, the increased potential at the node N4c is the differential potential ΔV (VDD·2/32) between the selected potential Va (VDD·14/32) and the reference potential Vref (VDD/2). Therefore, each of the divided potentials V1–V3 at the nodes N1–N3 is increased by the differential potential ΔV from the state that the currents Ib, Ic are equal to zero.

As a result, the divided potentials V1–V3 at the nodes N1–N3 are given by the following.

$$V1 = VDD \cdot 24/32 + \Delta V$$
$$= VDD \cdot 26/32$$
$$V2 = VDD \cdot 16/32 + \Delta V$$
$$= VDD \cdot 18/32$$
$$V3 = VDD \cdot 8/32 + \Delta V$$
$$= VDD \cdot 10/32$$

Further, when the switch SW8 switches on in response to the digital signal Din, the first differential amplifier 25 receives a divided potential of a node N4h as a selected potential Va.

The selected potential Va in this case is given by:

Va=VDD·9/32, if the resistors R1–R4 are set to have a resistance of '8', and the resistors R3a–R3h are set to have a resistance of '1'.

The first differential amplifier 25 controls the first transistor Tr1 so that the current Ia flows through it. The first and second current sources 27, 28 each supply the nodes N1, N3 of the voltage dividing circuit 22 with the currents Ib, Ic, respectively, which have the same value as the current Ia. The potentials at the nodes N1–N3 are each increased by the currents Ib, Ic, and the divided potential at the node N4*h* (namely, the selected potential Va) is increased. The first control circuit 24 controls the currents Ib, Ic supplied from the first and second current sources 27, 28 so that the divided potential at the node N4*h* coincides with the reference potential Vref.

At that moment, the increased potential at the node N4*h* is the differential potential ΔV (=VDD·7/32) between the selected potential Va (VDD·9/32) and the reference potential Vref (VDD/2). Therefore, each of the divided potentials V1–V3 at the nodes N1–N3 is increased by the differential potential ΔV when the currents Ib and Ic are equal to zero.

As a result, the divided potentials V1–V3 at the nodes N1–N3 are given by the following.

$$V1 = VDD \cdot 24/32 + \Delta V$$
$$= VDD \cdot 31/32$$
$$V2 = VDD \cdot 16/32 + \Delta V$$
$$= VDD \cdot 23/32$$
$$V3 = VDD \cdot 8/32 + \Delta V$$
$$= VDD \cdot 15/32$$

FIG. 6 illustrates the analog signal Aout obtained by appropriately controlling the switches SW1–SW8 and the switches SW9*a*–SW9*c*. As shown in FIG. 6, the analog signal Aout comprises integer multiples of the potential difference (VDD−VSS)/32. The potential difference between the higher potential supply VDD and the lower potential supply VSS is divided into 32 equal potentials. That is, the switches SW1*a*–SW3*b* connected in parallel with the resistors R2*a*–R4*b*, as shown in the conventional case, become unnecessary. An advantage of the present invention is that the resistances of the switches SW1*a*–SW3*b* while turned is eliminated, and the 32 equally divided potentials are obtained.

The capacitance of the capacitor C1 in FIG. 4 includes the capacitance of the wiring between the common node N6 and the second amplifier 29, the capacitance of the input terminal of the second amplifier 29, and the capacitances of the resistors R1–R4. The capacitor C1 is provided to inhibit adverse affects due to switching noise. The advantage of the present invention will be described in contrast with the conventional D/A converter. The conventional D/A converter does not include the first and second current supply sources 27, 28, but includes the voltage dividing circuit 22, the second amplifier 29, and the capacitor C1.

Figure 7A:
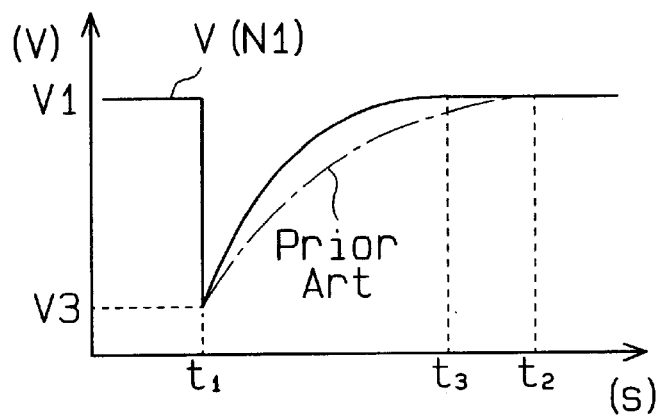
FIG. 7A–FIG. 7C are waveform charts of the voltages at each node in the D/A converter in FIG. 4.
Figure 7B:
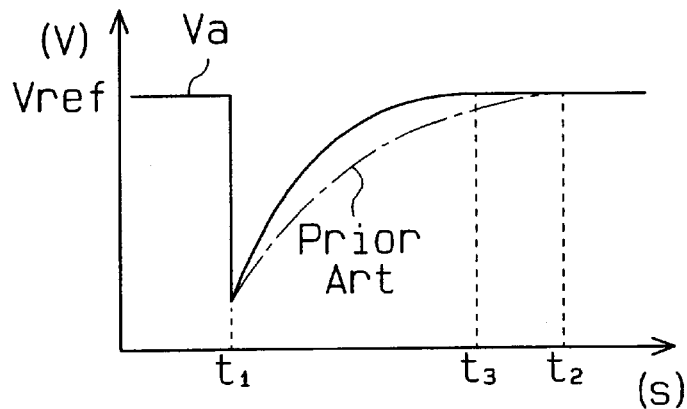
Figure 7C:
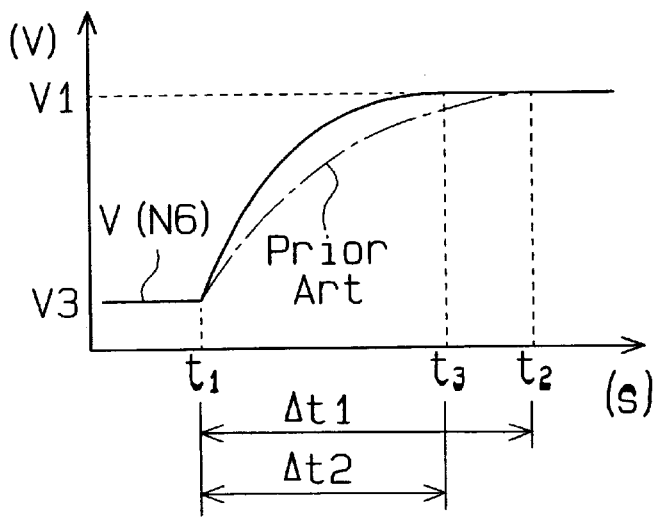

When the switch SW9*c* is switched on, for example, the potential V(N6) at the node N6 is set to the divided potential V3, as shown in FIG. 7C. When the switch SW9*a*, instead of the switch SW9*c*, is switched on at time t1 as shown in FIG. 7A–FIG. 7C, the potential V(N1) at the node N1 falls to the potential V3 corresponding to the electric charge stored in the capacitor C1. Accompanied with this change, the selected potential Va output to the first control circuit 24 from the voltage dividing circuit 22 goes down temporarily.

Thereafter, the capacitor C1 receives the charge from the first supply line L1 through the resistor R1. The potential V(N6) rises in accordance with the potential difference between both the terminals of the resistor R1 and the time constant determined by the resistance of the first resistor R1 and the capacitance of the capacitor C1. At time t2, the potential V(N6) reaches the potential V(N1) and is maintained constant. Therefore, the operating speed of the conventional D/A converter is defined by the time interval Δt1 between the time t1 and t2.

On the other hand, in the D/A converter 21 of the present invention, when the switch SW9*a*, instead of the switch SW9*c*, is switched on at time t1, the potential V(N1) at the node N1 falls to the potential V3 corresponding to the electric charge stored in the capacitor C1. Accompanied with this change, the selected potential Va output to the first control circuit 24 from the voltage dividing circuit 22 goes down temporarily.

Thereafter, the capacitor C1 is supplied with the electric charge by the current through the first resistor R1 and the electric charge by the current Ib supplied to the node N1 from the first current source 27. Therefore, the amount of electric charge per unit time supplied to the capacitor C1 is increased in comparison to the conventional case. Thus, the potential V(N6) at the node N6 rises to the predetermined potential faster than the conventional case illustrated by the continuous line in FIG. 7A–FIG. 7C. At time t3 shorter than time t2, the potential V(N6) at the node N6 reaches the potential V(N1) of the node N1, and stays constant. Therefore, the time interval from the time when the switches are switched until the time when the potential V(N6) at the node N6 reaches the predetermined potential is Δt2 (t3−t1), which is a shorter time than for the conventional D/A converter. That is, the operating speed of the D/A converter 21 is faster than the conventional D/A converter. The improvement in the operating speed decreases, the energy of a glitch produced when the switches SW9*a*–SW9*c* are switched. The energy of a glitch is determined, for example, by the area of the waveform of a glitch. Therefore, if a glitch has a higher peak, or if it continues a longer time, the energy of the glitch is higher. According to the present invention, the duration of any glitch is shorter than any glitch in the conventional D/A converter, and consequently, the glitch energy is lower.

Figure 8:
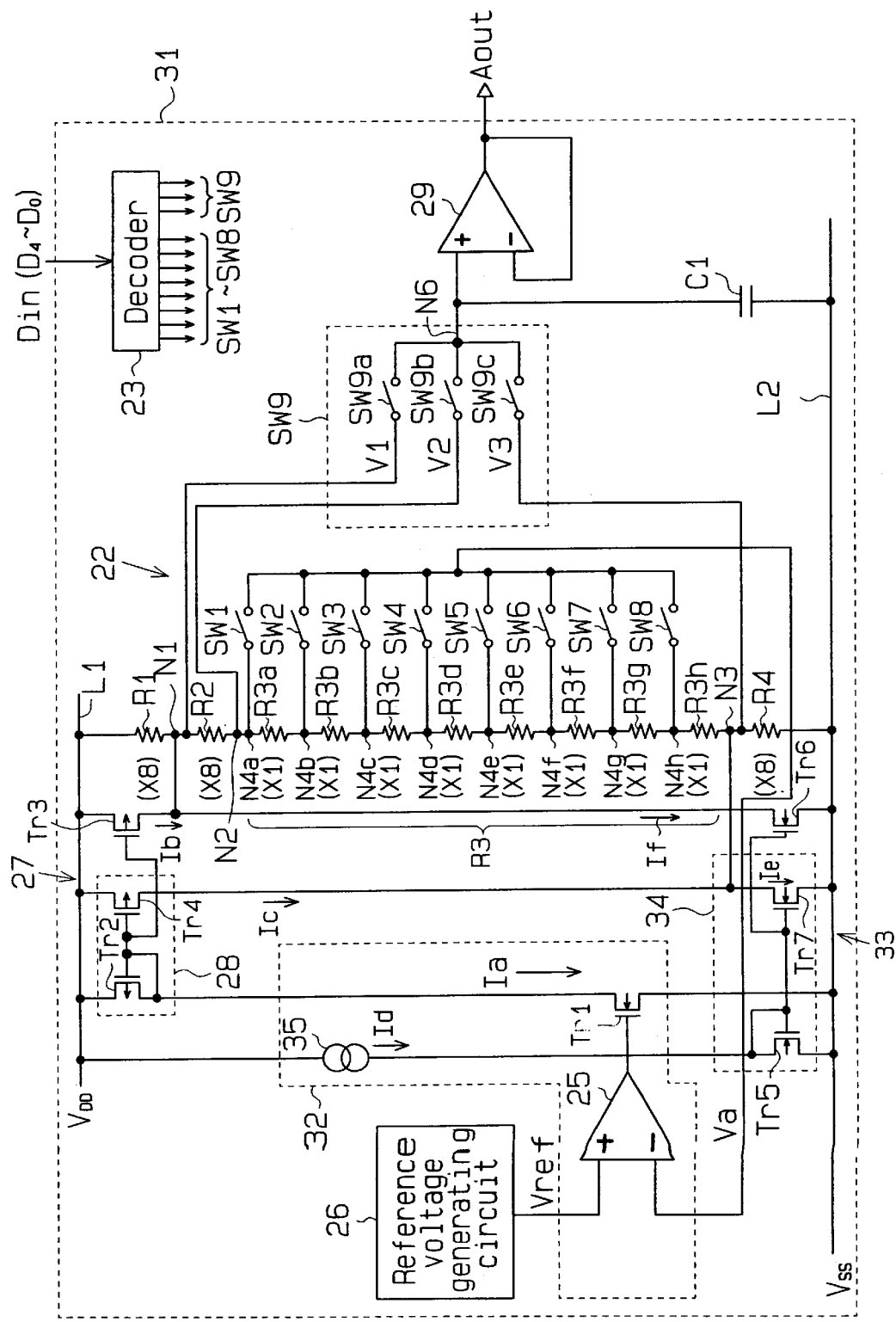
FIG. 8 is a circuit diagram of a D/A converter relating to a second embodiment of the present invention.

FIG. 8 is a circuit diagram of a D/A converter 31 relating to a second embodiment of the present invention. To avoid a redundant description, like or same reference numerals are given to those components which are the same as the corresponding components of the first embodiment.

A first control circuit 32 contains a stabilized current circuit 35, in addition to the first differential amplifier 25 and the first transistor Tr1. A first terminal of the stabilized current circuit 35 is connected to the first supply line L1 of the higher potential supply VDD, and a second terminal is connected to the drain of a fifth transistor Tr5, which is preferably an N-channel MOS transistor. The source of the fifth transistor Tr5 is connected to the second supply line L2 of the lower potential supply VSS, and the drain is connected to its own gate and the gates of a sixth transistor Tr6 and a seventh transistor Tr7, which are preferably N-channel MOS transistor.

The source of the sixth transistor Tr6 is connected to the second supply line L2, and the drain is connected to the node N1 of the voltage dividing circuit 22. The source of the seventh transistor Tr7 is connected to the second supply line L2, and the drain is connected to the node N3 of the voltage dividing circuit 22.

The fifth transistor Tr5 and the sixth transistor Tr6 form a current mirror circuit which operates as a third current source 33. The fifth transistor Tr5 and the seventh transistor Tr7 form a current mirror circuit which operates as a fourth current source 34. The third and fourth current sources 33, 34 share the fifth transistor Tr5. The third current source 33 and the fourth 34 generate currents Ie and If, respectively, which have the same value as the current flowing through the fifth transistor Tr5 (namely, the current Id flowing through the constant current source 35). The directions of the currents Ie and If through the third and fourth current sources 33, 34 are the same as those of the currents Ib and Ic through the first and second current sources 27, 28.

Next, the operation of the D/A converter 31 will be described, focusing primarily on the first control circuit 32 and the third and fourth current sources 33, 34. In the D/A converter 31, the third and fourth current sources 33, 34 connected to the nodes N1 and N3, respectively, the currents Ie and If have an identical current value and continuously flow from the nodes N1, N3 to the second supply line L2. That is, the third and fourth current sources 33, 34 operates so as to lower the potentials of the nodes N1, N3. That is, the third and fourth current sources 33, 34 lower the selected potential Va compared with the reference potential Vref.

The first control circuit 32 controls the first and second current sources 27, 28 so that the potential Va approaches to coincide with the reference potential Vref. The potential V(N6) at the node N6 becomes coincident precisely with the reference potential Vref. Consequently, the differences between the potential of the analog signal Aout and a desired potential are decreased. That is, the third and fourth current sources 33, 34 operate to bring down the selected potential Va lower than the reference potential Vref. The first and second current sources 27, 28 operate to bring the selected potential Va into a coincidence with the reference potential Vref, thus improving the accuracy of the analog signal.

Further, the D/A converter 31 of the second embodiment reduces the energy of a glitch produced when generating the analog signal Aout. That is, the D/A converter 31 shortens the time interval from a time when the switches SW9a–SW9c are switched on in accordance with the upper two bits D4, D3 of the digital signal Din to a time when the potential of the analog signal Aout goes down to a desired potential and comes to a stabilized level. The shortening of this time interval reduces the energy of a glitch produced when the switches SW9a–SW9c are switched.

Figure 9A:
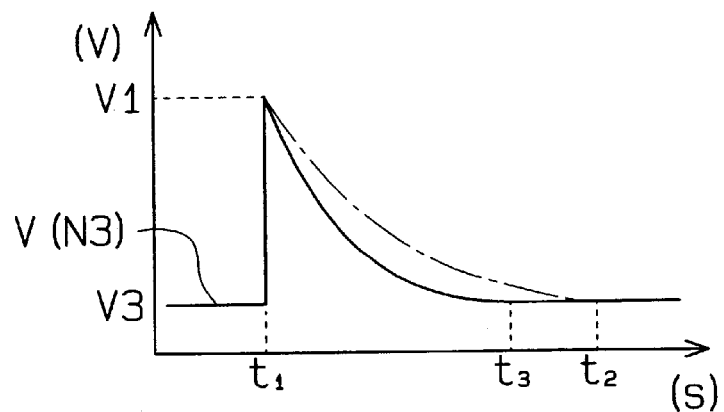
FIG. 9A and FIG. 9B are waveform charts of the voltages at each node in the D/A converter in FIG. 8.
Figure 9B:
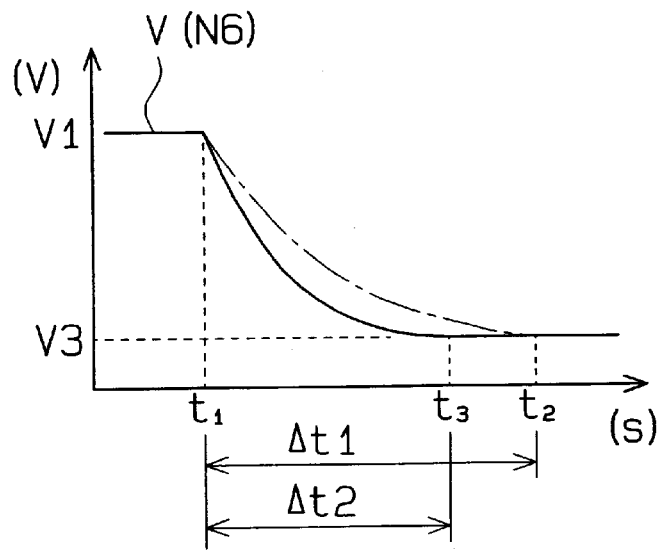

Consequently, as shown in FIG. 9A, when the switch SW9c instead of the switch SW9a is switched on at time t1, the potential V(N3) at the node N3 rises to the potential V1 by the electric charge stored in the capacitor C1. Accompanied with this change, the selected potential Va rises temporarily. Thereafter, the electric charge stored in the capacitor C1 is discharged into the second supply line L2 through the third resistor R3 and the third current source 33. Therefore, the electric charge per unit time discharged from the capacitor C1 is increased. As shown in FIG. 9B, the potential V(N6) at the node N6 goes down to the predetermined potential (V(N3)) at time t3, which is shorter than time t2, and holds the potential. The time t2 is the time when the potential V(N6) reaches the predetermined potential in the conventional D/A converter that does not contain the third current supply 33. Therefore, the time interval from the time when the switches SW9a–SW9c are switched until the time when the potential V(N6) reaches the predetermined potential is Δt2 (t3–t1), which is shorter than for the conventional D/A converter. In other words, the energy of a glitch produced when the switches SW9a–SW9c are switched is decreased, and the operating speed of the D/A converter 31 becomes faster than operating speed of the conventional D/A converter.

Figure 10:
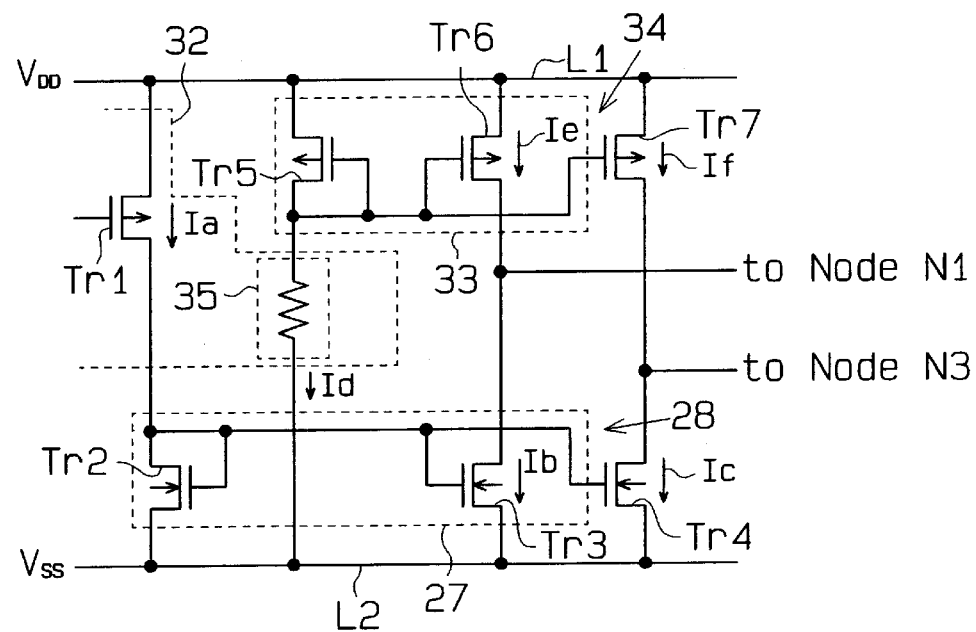
FIG. 10 is a circuit diagram of a part of the D/A converter in FIG. 8.

Referring to FIG. 10, the first and second current sources 27, 28 may be connected to the second supply line L2, and the third and fourth current sources 33, 34 may be connected to the first supply line L1. In this case, the first and second current sources 27, 28 include the third and fourth transistors Tr3, Tr4, respectively, which are preferably NMOS transistors, and the third and fourth current sources 33, 34 include the sixth and seventh transistors Tr6, Tr7, respectively, which are PMOS transistors. The first and second current sources 27, 28 supply the currents Ib and Ic having the same value as the current Ia flowing through the first transistor Tr1 to the second supply line L2 from the nodes N1 and N3. The third and fourth current sources 33, 34 supply the currents Ie and If having the same value as the current Id through the current circuit 35 to the nodes N1 an N3, respectively.

Figure 16:
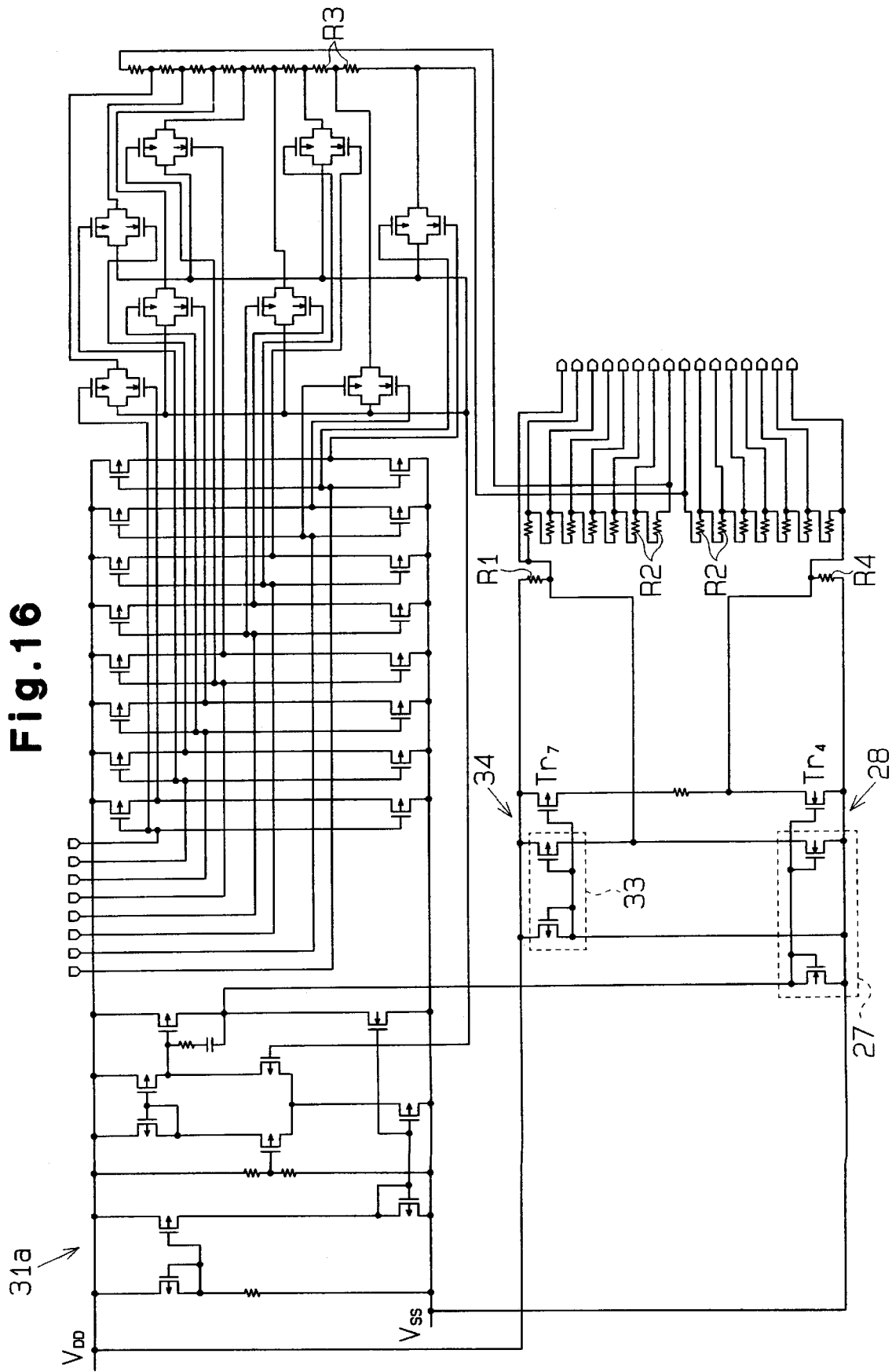
FIG. 16 is a more detailed circuit diagram of the D/A converter in FIG. 8.

FIG. 16 is a detailed circuit diagram of a D/A converter 31a similar to the D/A converter 31 in which the first through fourth current sources 27, 28, 33, 34 are connected as shown in FIG. 10. The D/A converter in FIG. 16 is provided with seven second resistors R2, in FIG. 8, between the first resistor R1 and the third resistor R3, and between the third resistor R3 and the fourth resistor R4. Further, the switch SW9 in FIG. 8 is comprised of 16 switches (not illustrated). The D/A converter 31a is able to respond to the lower three bits and the upper four bits of the digital signal Din. In FIG. 16, the switch SW9, capacitor C1, decoder 23, and second amplifier 29 are omitted.

In the D/A converters 21 and 31 of the first and second embodiments, the time interval (namely, the operating speed) from the time the digital signal Din is input until the time the output of the analog signal Aout reaches the stabilized potential is affected by the operating speed of the first control circuit 24 and 32 (namely, the operating speed of the first differential amplifier 25 for controlling the first transistor Tr1). Accordingly, the operating speed of the first differential amplifier 25 is required to be stabilized. The operating speed of the first differential amplifier 25 depends upon the value of an internal bias current generated by the constant current source 25a shown in FIG. 5. The internal bias current varies depending on the variation of the power supply potential. Accordingly, a constant current source is required which is able to supply a stabilized bias current regardless of variation of the power supply potential.

Figure 11:
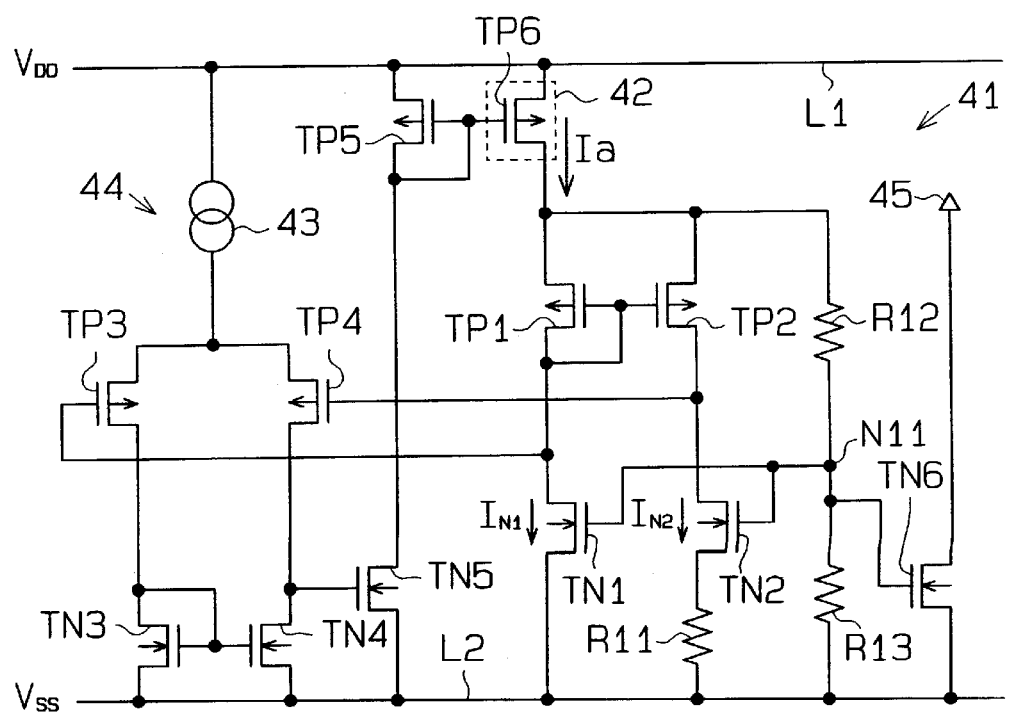
FIG. 11 is a circuit diagram of a stabilized current circuit for a differential amplifier.
Figure 12:
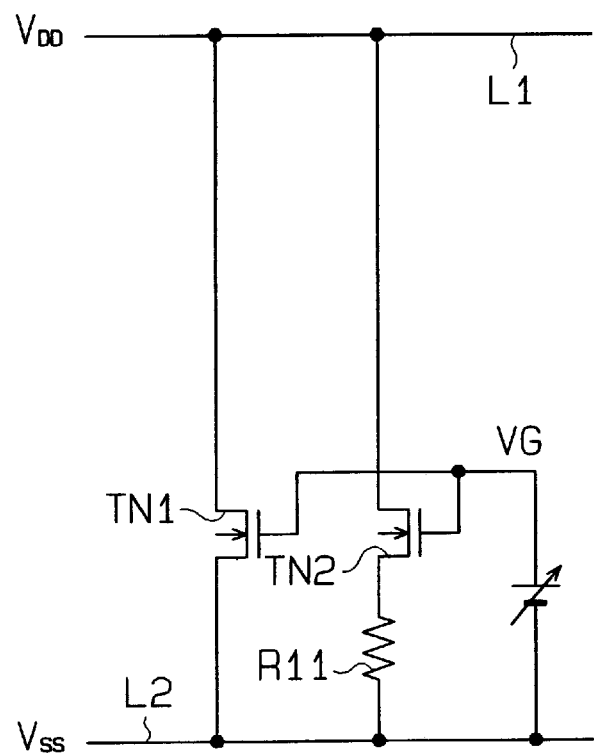
FIG. 12 is a simplified circuit diagram of a portion of the current circuit in FIG. 11 to explain a first operation principle of the stabilized current circuit.

FIG. 11 is a circuit diagram of an improved constant current circuit 41. The constant current circuit 41 can be used as a replacement for the constant current circuit 25a in FIG. 5 or the constant current circuit 35 in FIG. 10. The constant current circuit 41 includes first and second NMOS transistors TN1, TN2 whose gates are connected to each other. The second NMOS transistor TN2 preferably has n-fold device size compared to the first NMOS transistor TN1. The source of the first NMOS transistor TN1 is connected to the second supply line L2, and the source of the second NMOS transistor TN2 is connected to the second supply line L2 through a first resistor R11. The drains of the first and second NMOS transistors TN1, TN2 are connected to the drains of first and second PMOS transistors TP1 and TP2, respectively. The first and second PMOS transistors TP1 and TP2 form a current mirror circuit. The sources of the first and second PMOS transistors TP1, TP2 are connected to each other and to the first supply line L1 through a current source 42. The drains of the first and second PMOS transistors TP1, TP2 are connected to the gates of third and fourth PMOS transistors TP3, TP4, respectively.

The sources of the third and fourth PMOS transistors TP3, TP4 are connected to each other and to the first supply line L1 through a constant current source 43. The drains of the third and fourth PMOS transistors TP3, TP4 are connected to the drains of a third and fourth NMOS transistors TN3, TN4, respectively. The third and fourth NMOS transistors TN3, TN4 form a current mirror circuit. The sources of the third and fourth NMOS transistors TN3, TN4 are connected to the second supply line L2. The NMOS transistors TN3, TN4, the PMOS transistors TP3, TP4 and the constant current source 43 form a differential amplifier 44.

The drain of the third NMOS transistor TN3 is connected to its gate and to the gate of the fourth NMOS transistor TN4. The gate of a fifth NMOS transistor TN5 is connected to the drain of the fourth NMOS transistor TN4. The source of the fifth transistor TN5 is connected to the second supply line L2 and the drain is connected to the drain of a fifth PMOS transistor TP5. The source of the fifth PMOS transistor TP5 is connected to the first supply line L1 and the gate is connected to its drain and to the gate of a sixth PMOS transistor TP6.

The sixth PMOS transistor TP6 forms the constant current circuit 42. The source of the sixth PMOS transistor TP6 is connected to the first supply line L1 and the drain is connected to the sources of the first and second PMOS transistors TP1, TP2. The fifth and sixth PMOS transistors TP5, TP6 form a current mirror circuit. The drain of the sixth PMOS transistor TP6 is connected to the second supply line L2 through a second resistor R12 and a third resistor R13. A node N11 between the second resistor R12 and the third resistor R13 is connected to the gates of the first and second NMOS transistors TN1, TN2 and to the gate of a sixth NMOS transistor TN6. The source of the sixth NMOS transistor TN6 (an output transistor) is connected to the second supply line L2 and the drain is connected to an output terminal 45. The second and third resistors R12, R13 function as a gate voltage setting circuit that determines the gate voltages of the first and second NMOS transistors TN1, TN2.

The second and third resistors R12, R13 form a voltage dividing circuit that divides the potential difference between the potential of the drain of the sixth PMOS transistor TP6 and the potential of the lower potential supply VSS and supplies the divided potential to the node N11. The divided potential of the node N11 is supplied to the gates of the first and second NMOS transistors TN1, TN2, and to the gate of the sixth NMOS transistor TN6.

In the constant current circuit 41, the P-channel transistors and the N-channel transistors may be replaced each other. Further, the higher potential supply VDD and the lower potential supply VSS may be replaced with each other. This type of constant current circuit is preferably used as a replacement for the current source 35 in FIG. 10.

Figure 13:
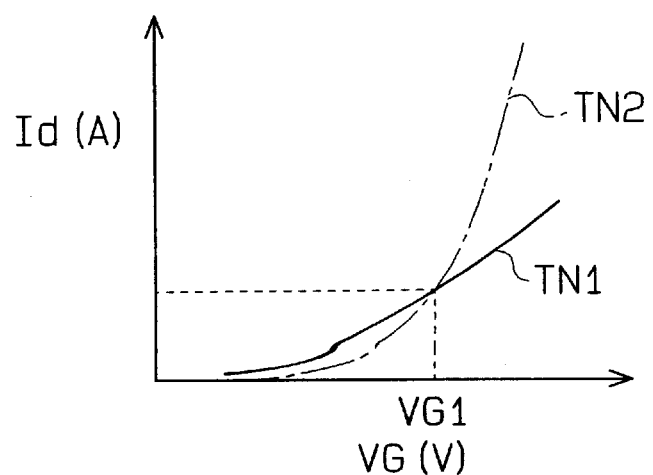
FIG. 13 is a graph illustrating the relationship between the gate voltage and the drain current through the first and second NMOS transistors of FIG. 12.
Figure 14:
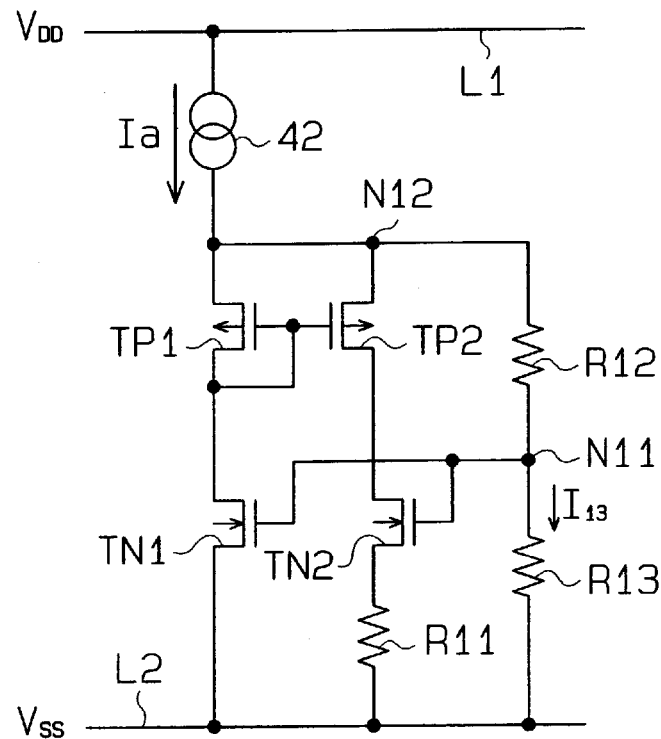
FIG. 14 is a second simplified circuit diagram of a portion of the circuit in FIG. 11 to explain a second operation principle of the stabilized current circuit.

Next, the operation of the D/A converter 41 will be described with reference to FIG. 12–FIG. 15. Simplified circuit diagram of the first and second NMOS transistor TN1, TN2 to explain a first operation principle of the constant current circuit 41. Each of the gates of the first and second NMOS transistors TN1, TN2 is supplied with a gate voltage VG from a variable voltage source. FIG. 13 is a graph to illustrate the relation between the gate voltage VG and the drain current Id through the first and second NMOS transistors TN1, TN2. FIG. 13 shows that the drain current Id versus gate voltage VG characteristic of the second NMOS transistor TN2 has a slope different from that of the first NMOS transistors TN1, which results from the first resistor R11 and the device size of the second NMOS transistor TN2. As shown in FIG. 13, the first and second NMOS transistors TN1, TN2 have the drain currents having a substantially identical value in response to a gate voltage VG1. However, the values of the drain currents of the first and second NMOS transistors TN1, TN2 are determined by the drain voltages (namely, the higher potential supply VDD) of the first and second NMOS transistors TN1, TN2. Therefore, a second operation principle shown in FIG. 14, is that constant drain currents flow through the first and second NMOS transistors TN1, TN2 regardless of variation of the higher potential supply VDD.

The current source 42 supplies a current Ia to the first and second PMOS transistors TP1, TP2. A current I13 flows through the second resistor R12 and the third resistor R13. The potential supplied to the gates of the first and second NMOS transistors TN1, TN2 is determined by the resistance of the third resistor R13 and the value of the current I13. Further, the potential of the sources (node N12) of the first and second PMOS transistors TP1, TP2 is determined by the value of the current I13 and the resistance of the second resistor R12. Therefore, the source potential (potential at the node N12) of the first and second PMOS transistors TP1, TP2 is determined in accordance with the gate voltage (potential at the node N11) of the first and second NMOS transistors TN1, TN2. As a result, the potential at the node N12 is not affected by a variation of the higher potential supply VDD.

The first and second PMOS transistors TP1, TP2, having the same device size, operate as a current mirror circuit which have the same current as the current through the first and second NMOS transistors TN1, TN2. Therefore, the drain voltages of the first and second PMOS transistors TP1, TP2 are not affected by a variation of the higher potential supply VDD, and are set to an identical value. As a result, the first and second NMOS transistors TN1, TN2 have the currents having an identical value, in accordance with the predetermined gate voltage VG1 determined by the current Ia supplied from the current source 42.

Figure 15:
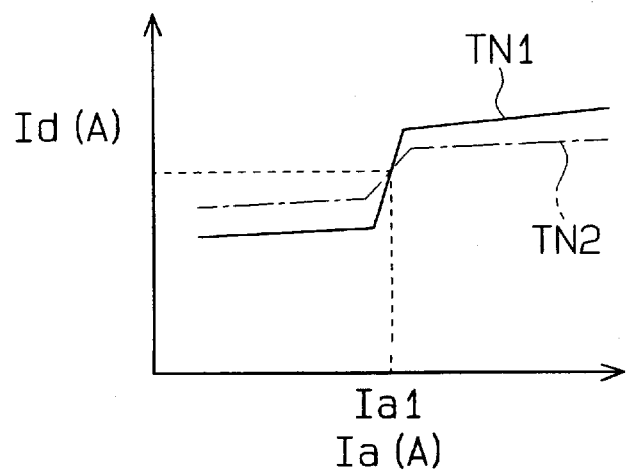
FIG. 15 is a graph illustrating the relationship between a source current and the drain currents through the first and second NMOS transistors of FIG. 14.

The supply of a current Ia1 (see FIG. 15) from the current source 42 sets the currents through the first and second NMOS transistors TN1, TN2 (namely, the drain voltages of the transistors TN1, TN2) at a substantially identical value. In other words, the current Ia supplied from the current source 42 is adjusted, so that the drain voltages of the first and second NMOS transistors TN1, TN2 become substantially equal without being affected by the variation of the higher potential supply VDD. FIG. 15 shows that the drain voltages of the first and second NMOS transistors TN1, TN2 become substantially equal when the current from the current source 42 is equal to the predetermined current Ia1.

Referring now to FIG. 11, the drain voltages of the first and second NMOS transistors TN1, TN2 are supplied to the gates of the third and fourth PMOS transistors TP3, TP4 forming the differential amplifier 44. The differential amplifier 44 controls the gate voltage of the fifth NMOS transistor TN5 so that the drain voltages of the first and second NMOS transistors TN1, TN2 become coincident with each other. The fifth NMOS transistor TN5 has a current in accordance with the gate voltage thereof. The fifth and sixth PMOS transistors TP5, TP6 has the current Ia that is the same value as the current flowing through the fifth NMOS transistor TN5. In this manner, the current Ia flowing through the current source 42 is controlled by the operation of the differential amplifier 44 so that the drain voltages of the first and second NMOS transistors TN1, TN2 become coincident with each other. When a drain current IN1 of the first NMOS transistor TN1 is larger than a drain current IN2 of the second NMOS transistor TN2, the differential amplifier 44 increases the current Ia flowing through the current source 42. On the other hans, when the drain current IN1 is smaller than the drain current IN2, the differential amplifier 44 decreases the current Ia. Thus, when the drain current IN1 of the first NMOS transistor TN1 becomes substantially equal to the drain current IN2 of the second NMOS transistor TN2, the current Ia through the current source 42 is stabilized. At that moment, the current Ia is not influenced by a variation of the higher potential supply VDD. The current Ia through the current source 42 determines the potential of the node N11, and a current according to the potential of the node N11 flows through the sixth NMOS transistor TN6. Therefore, the current flowing through the sixth NMOS transistor TN6 is not influenced by a variation of the higher potential supply VDD. The current flowing through the sixth NMOS transistor TN6 is output from the constant current circuit 41 as an output current Iout. The output current Iout is used for supplying the bias current of the first differential amplifier 25 in FIG. 4 and FIG. 6. The first differential amplifier 25 is operated by the stabilized bias current, which enhances the operating speeds of the D/A converters 21, 31.

Figure 17B:
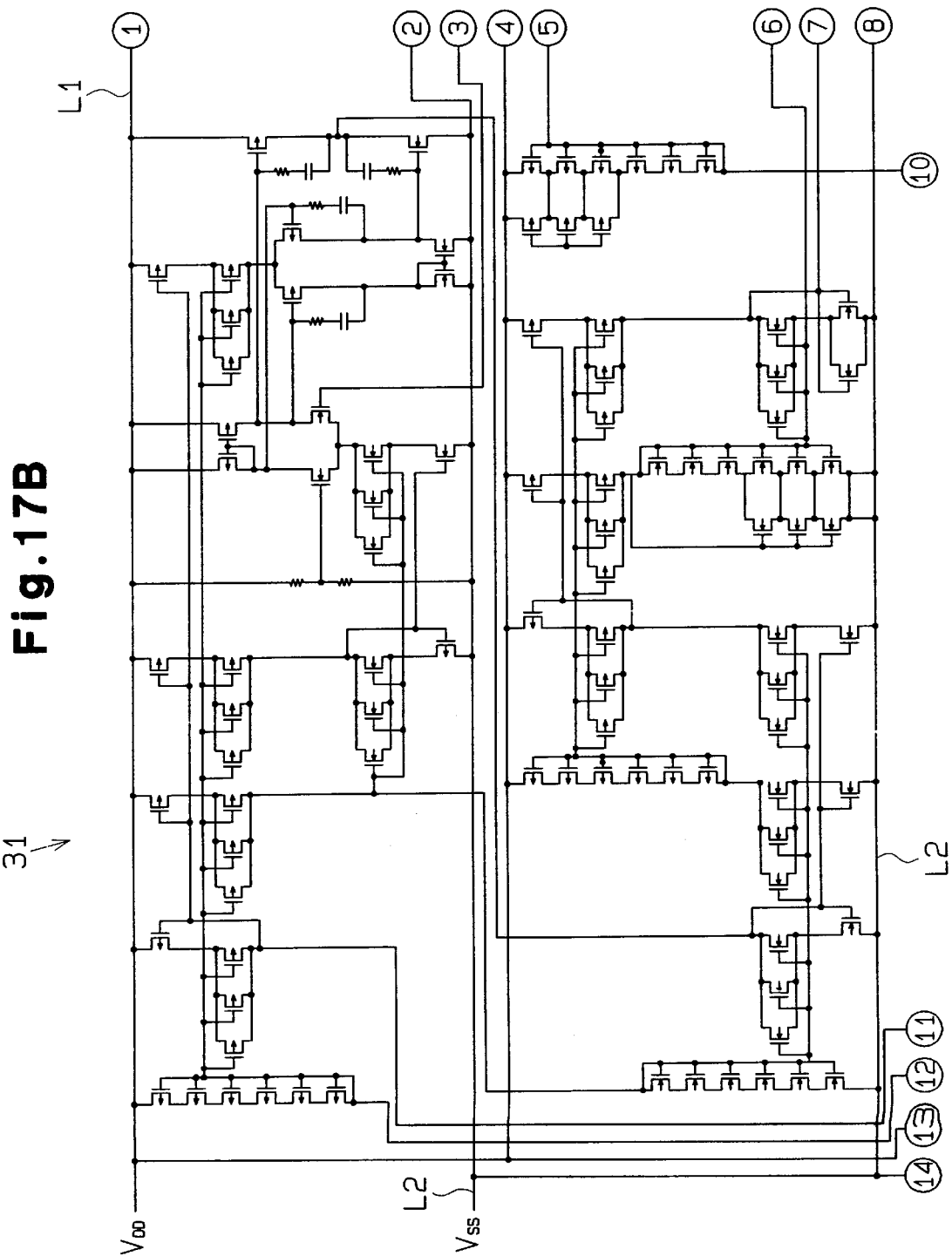
Figure 17C:
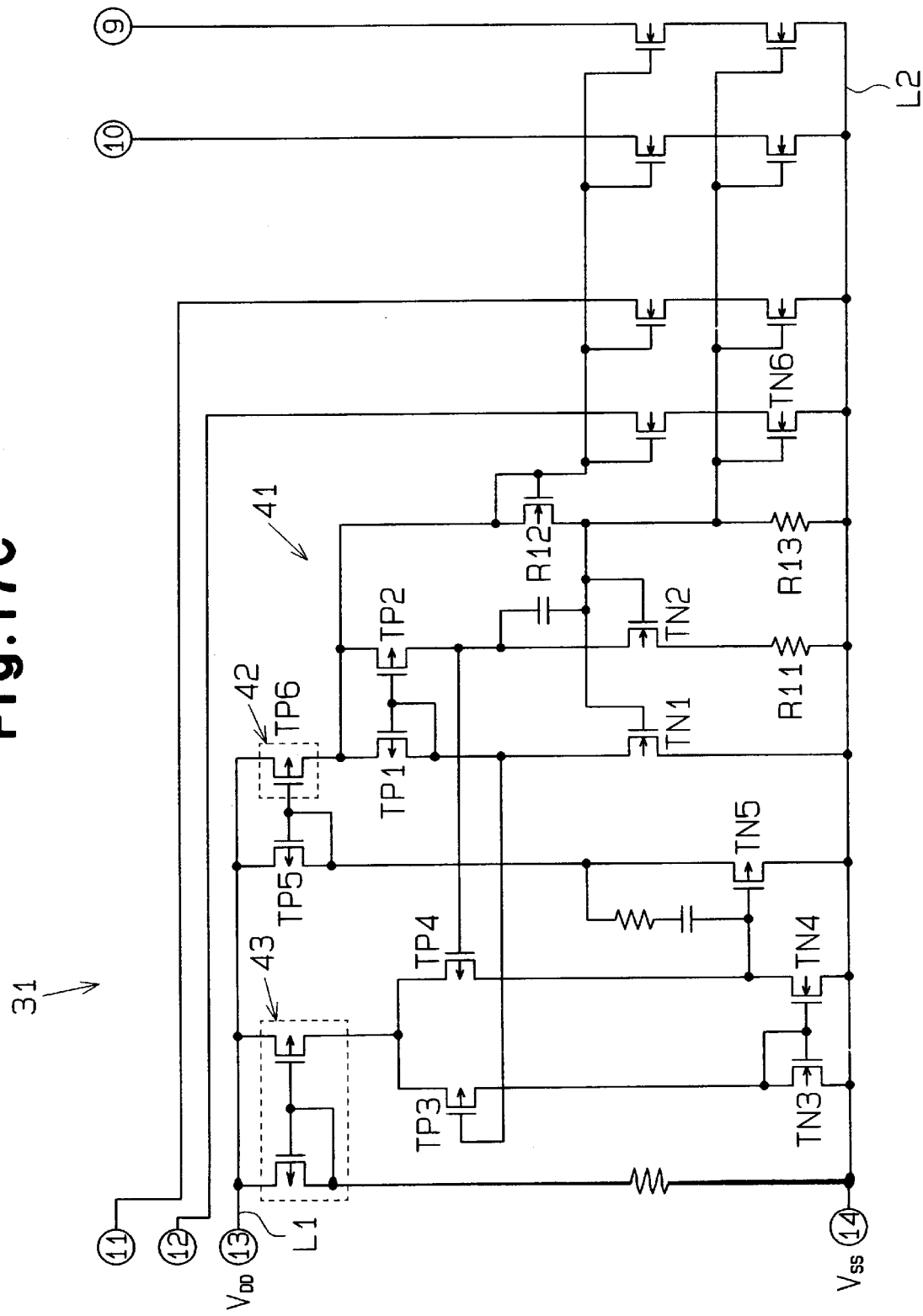

FIG. 17A–FIG. 17C are detailed circuit diagrams of the D/A converter 31 relating to the second embodiment, including the constant current circuit 41 in FIG. 11. This D/A converter 31 includes eight third resistors R3, and is able to respond to the digital signal Din of the lower three bits and the upper four bits. In FIG. 17A–FIG. 17C, the switch SW9, capacitor C1, decoder 23, and second amplifier 29 are omitted.

The first and second embodiments may appropriately change the numbers of resistors and switches connected between the higher potential supply VDD and the lower potential supply VSS. The first and second embodiments may appropriately change or alter the bit numbers of the input digital signal Din.

Figure 18:
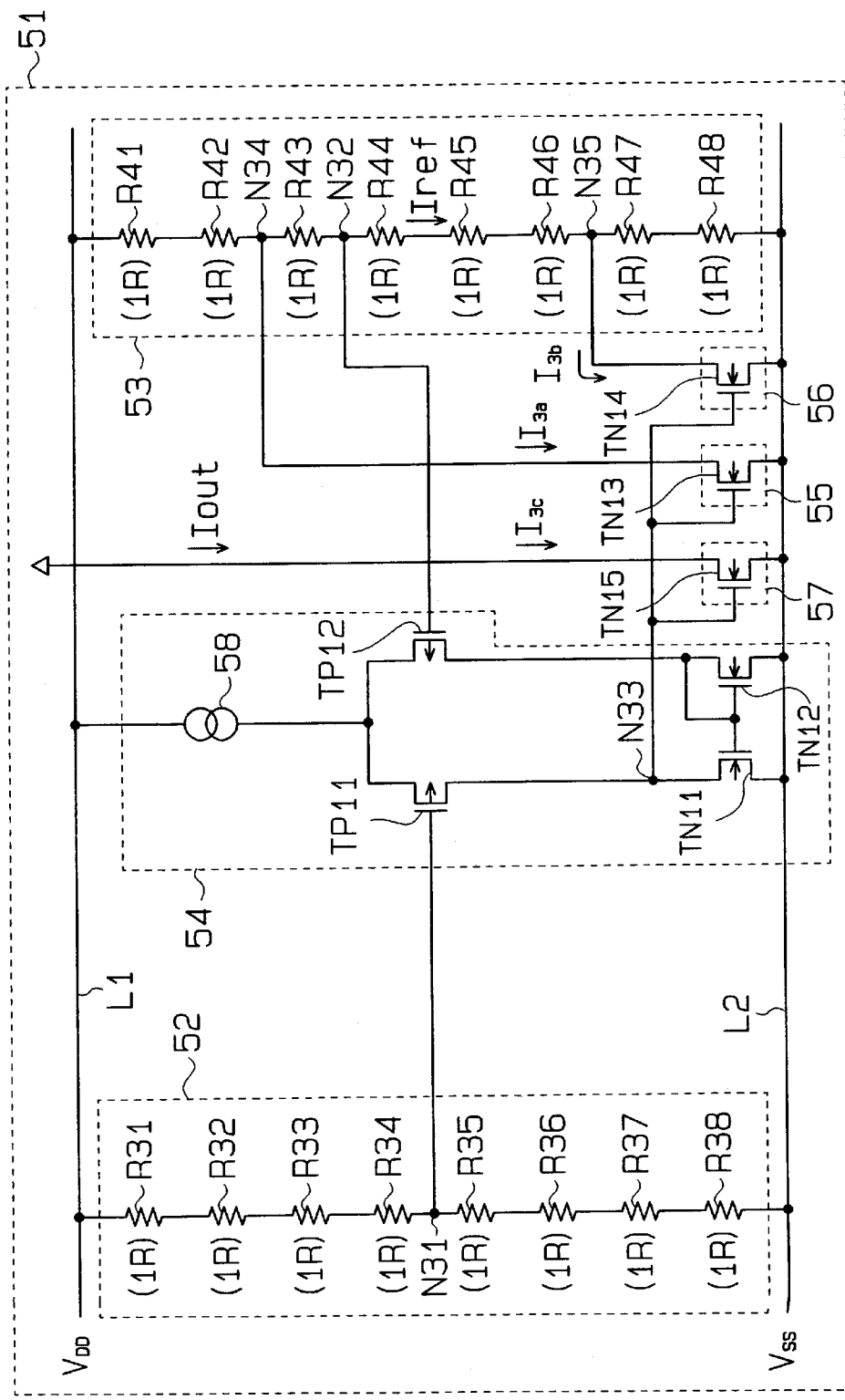
FIG. 18 is a circuit diagram of a current generating circuit relating to a third embodiment of the present invention.

FIG. 18 is a circuit diagram of a current generating circuit 51 relating to a third embodiment of the present invention. The current generating circuit 51 is provided with first and second voltage dividing circuits 52, 53, a differential amplifier 54, and first through third current sources 55, 56, 57. The first voltage dividing circuit 52 includes eight resistors R31-R38 connected in series between the first supply line L1 and the second supply L2. A node N31 between the resistors R34 and R35 is connected to the differential amplifier 54. The resistors R31–R38 preferably have identical resistance. Therefore, the node N31 has an intermediate potential ((VDD–VSS)/2) between the higher potential supply VDD and the lower potential supply VSS.

The second voltage dividing circuit 53 includes eight resistors R41–R48 connected in series between the first supply line L1 and the second supply line L2. The resistors R41–R48 preferably have an identical resistance. Therefore, the combined resistance of the resistors R41, R42 connected between the first supply line L1 and a node N34 is substantially equal to the combined resistance of the resistors R47, R48 connected between the second supply line L2 and a node N35. A node N32 between the resistors R43 and R44 is connected to the differential amplifier 54.

The differential amplifier 54 includes a pair of first and second PMOS transistors TP11, TP12. The gate of the first PMOS transistor TP11 is connected to the node N31 of the first voltage dividing circuit 52, and the gate of the second PMOS transistor TP12 is connected to the node N32 of the second voltage dividing circuit 53. The sources of the first and second PMOS transistors TP11, TP12 are connected to each other and to the first supply line L1 through a current source 58. The drains of the first and second PMOS transistors TP11, TP12 are respectively connected to the drains of a pair of first and second NMOS transistors TN11.

The sources of the first and second NMOS transistors TN11, TN12 are connected to the second supply line L2. The gate of the first NMOS transistor TN11 is connected to the gate and the drain of the second NMOS transistor TN12. The first and second NMOS transistors TN11, TNi2 form a current mirror circuit. A node N33 between the first NMOS transistor TN11 and the first PMOS transistor TP11 is connected to the first through third current sources 55–57.

The first through third current sources 55–57 comprises NMOS transistors TN13–TN15, respectively. The gates of the NMOS transistors TN13–TN15 are connected to the node N33, and the sources are connected to the second supply line L2. The first through third current sources 55–57 supply currents I3a, I3b, I3c which have substantially the same value. The drain of the third NMOS transistor TN13 is connected to the node N34. The first current source 55 generates the current I3a in response to the potential of the node N33, which flows from the node N34 to the second supply line L2. The drain of the fourth NMOS transistor TN14 is connected to the node N35. The second current source 56 generates the current I3b in response to the potential of the node N33, which flows from the node N35 to the second supply line L2.

Next, the operation of the current generating circuit 51 will be described. The differential amplifier 54 controls the gate voltages of the third and fourth NMOS transistors TN13, TN14 in response to a potential difference between the nodes N31 and N32. The currents I3a and I3b flow through the third and fourth NMOS transistors TN13, TN14 in response to the gate voltages thereof. Therefore, the first and second current sources 55, 56 generate the currents I3a, I3b in response to the potential difference between the node N31 and N32.

The combined resistance of the resistors R41 and R42 is substantially equal to the combined resistance of the resistors R47 and R48. Therefore, the potentials of the nodes N34 and N35 vary in accordance with the values of the currents I3a and I3b flowing through the first and second current sources 55, 56, while the potential difference between the nodes N34 and N35 is held constant. The differential amplifier 54 controls the gate voltages of the third and fourth NMOS transistors TN13, TN14 so that the potential of the node N31 becomes substantially equal to the potential of the node N32 (that is, the differential amplifier 54 controls the currents I3a, I3b that flow from the nodes N34, N35 to the second supply line L2). When the potential of the node N31 becomes substantially coincident with that of the node N32, the first and second currents I3a, I3b are stabilized and held constant.

When each of the resistors R31–R38, R41–R48 is set to the resistance '1', the potentials VN31, VN32 of the nodes N31, N32 are as follows.

VN31=(VDD–VSS)·4/8+VSS

VN32=(VDD–VSS)·5/8+VSS

Therefore, the differential amplifier 54 lowers each of the potentials of the nodes N32, N34, N35 by the differential potential ΔV ((VDD–VSS)/8) between the potential VN31 and VN32.

The currents I3a, I3b flowing through the first and second current sources 55, 56 are obtained by the product of the differential potential ΔV and the impedance between the node N35 and the supply line L2, as follows.

$$I3a = I3b = ((VDD - VSS)/8)/2$$
$$= (VDD - VSS)/16$$

The third current source 57 generates the current I3c (output current Iout of the constant current circuit 51), which assumes the same value as that of the currents I3a, I3b. Therefore, the current I3c is given by:

I3c=I3a=I3b=(VDD−VSS)/16.

Figure 20:
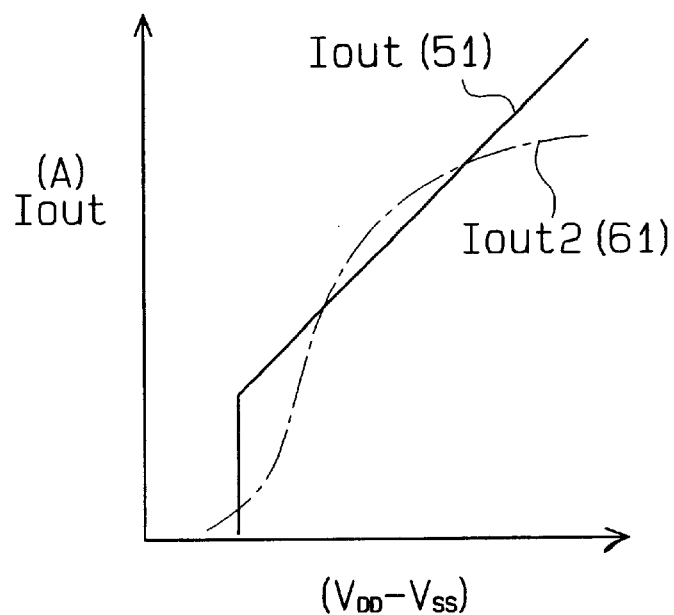
FIG. 20 is a graph of the output currents versus voltage for the circuits in FIG. 18 and FIG. 19.

As shown in FIG. 20, the output current Iout (51) of the constant current circuit 51 varies linearly according to the variation of the supply potential. Therefore, the constant current circuit 51 is capable of supplying an arbitrary output current Iout.

Figure 19:
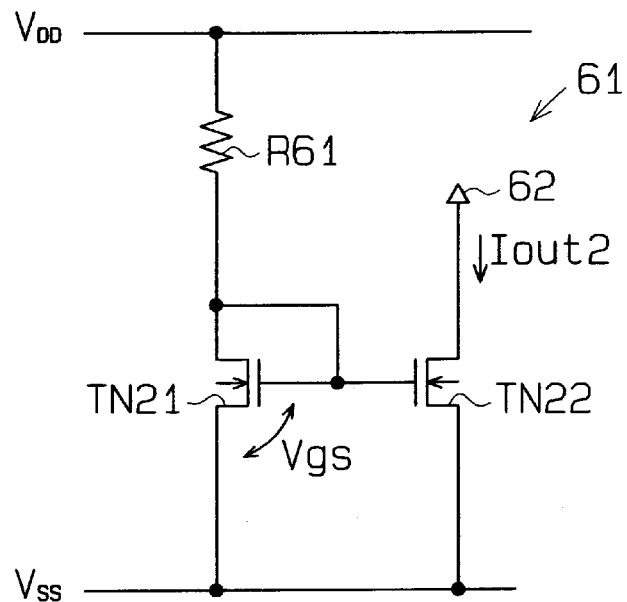
FIG. 19 is a circuit diagram of a conventional current generating circuit.

FIG. 19 is a circuit diagram of a conventional current generating circuit 61. The current generating circuit 61 includes a pair of NMOS transistors TN21, TN22 that form a current mirror circuit, and a resistor R61. The current generating circuit 61 outputs a current Iout2 from an output terminal 62. Provided that the resistance of the resistor R61 is Rn and the potential between the gate and the source of the NMOS transistor TN21 is Vgs, the current Iout2 is given as follows.

Iout2={(VDD−VSS)−Vgs}/Rn

The potential Vgs between the gate and the source of the NMOS transistor TN21 varies depending on the drain current and drain voltage of the transistor TN21. Therefore, the output current Iout2(61) does not vary linearly according to the variation of the supply potential, as shown by the dash line in FIG. 20. Therefore, to obtain the output current Iout2 of a desired value requires consideration for the characteristic of the NMOS transistor TN21.

In the third embodiment, provided that the node N31 is set at the intermediate potential ((VDD−VSS)/2) of the higher potential supply VDD and the lower potential supply VSS, the resistors R31–R38 and R41–R48 may have different resistances. Furthermore, the number of the resistors between the first supply line L1 and the node N31 may be different from the number of the resistors between the node N31 and the second supply line L2. Further, the first through the third current sources 55–57 each may include a plurality of NMOS transistors. The number of the current sources connected to the node N33 may also vary.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A voltage generating circuit comprising:
   a voltage dividing circuit including a first impedance element connected to a first supply line, a second impedance element connected to a second supply line, the second impedance element having substantially the same impedance as the first impedance element, and a third impedance element connected between the first and second impedance elements, having a predetermined impedance, wherein voltages based on the impedances of the first to third impedance elements are generated at a first node between the first and third impedance elements and at a second node between the second and third impedance elements; and
   a first current source and a second current source connected to the first node and the second node, respectively, supplying currents having substantially the same value to the first and second nodes, respectively.

2. The circuit of claim 1, further comprising a control circuit that receives a predetermined reference voltage and a voltage of the third impedance element as an input voltage, compares the input voltage with the predetermined reference voltage, and, on the basis of the compared result, controls the currents supplied from the first and second current sources to bring the input voltage to an equivalence with the reference voltage.

3. A digital-to-analog conversion circuit comprising:
   a voltage dividing circuit including a first impedance element connected to a first supply line, a second impedance element connected to a second supply line, the second impedance element having substantially the same impedance as the first impedance element, and a third impedance element connected between the first and second impedance elements, having a predetermined impedance, wherein the third impedance element includes a plurality of sub-impedance elements for dividing a voltage between the first and second impedance elements to generate a plurality of divided voltages at nodes between the sub-impedance elements;
   a first current source connected to a first node between the first and third impedance elements and a second current source connected to a second node between the second and third impedance elements, the first and second current sources supplying first and second currents having substantially identical values to the first and second nodes, respectively;
   a selecting unit that selects one of the nodes between the sub-impedance elements and outputs the node voltage as a selected voltage on the basis of the first and second currents and the impedances of the first to third impedance elements; and
   a control circuit that receives the selected voltage and a predetermined reference voltage, compares the selected voltage with the predetermined reference voltage, and, on the basis of the compared result, controls the first and second currents supplied from the first and second current sources to bring the selected voltage to a substantial equivalence with the reference voltage, wherein the first and second node voltages are used for generating an analog voltage signal.

4. The circuit of claim 3, wherein the control circuit comprises:
   a comparing circuit that receives the selected voltage and the reference voltage and generates an output signal having a voltage that responds to a voltage difference between the selected voltage and the reference voltage; and
   a first transistor connected to the first and second current sources that has a gate to receive the output signal from the comparing circuit and provides a current that responds to the gate voltage, wherein the first and second currents have substantially the same value as the current flowing through the first transistor to the first and second nodes.

5. The circuit of claim 4, wherein the first and second current sources each includes first and second current mirror circuits.

6. The circuit of claim 5, wherein the first and second current mirror circuits each includes a first transistor and share a second transistor connected to the first transistor.

7. The circuit of claim 3, further comprising third and fourth current sources each connected to the first and second current sources, which generate currents having an identical direction and a substantially identical value to the currents supplied from the first and second current sources.

8. The circuit of claim 7, wherein each of the third and fourth current sources includes a current mirror circuit.

9. The circuit of claim 3, wherein a digital signal includes an upper bit digital signal and a lower bit digital signal, the voltage dividing circuit comprised a plurality of impedance elements including the first and second impedance elements, the plurality of impedance elements being set to comply with a number corresponding to the upper bit digital signal, and the plurality of the sub-impedance elements are set to comply with a number corresponding to the lower bit digital signal.

10. The circuit of claim 9, further comprising:
   a second selecting unit that selects, in response to the upper bit digital signal, one of the divided voltages of a plurality of nodes including the first and second nodes between the plurality of the impedance elements, and
   a buffer circuit, connected to the second selecting unit, that receives the selected divided voltage and outputs an analog signal having a voltage generated from the selected divided voltage.

11. A constant current circuit comprising:
   first and second transistors connected in parallel between first and second supply lines, which have gates connected with each other, wherein the first and second transistors are different sizes;
   an output transistor having a gate connected to the gates of the first and second transistors; and
   a control circuit that controls the voltage applied to the gates of the first and second transistors so that drain currents having substantially the same value flow through the first and second transistors, wherein the drain current of the output transistor is constant.

12. The circuit of claim 11, wherein the control circuit includes an impedance element connected between the source of the second transistor and the second supply line.

13. The circuit of claim 12, wherein the control circuit includes a current mirror circuit connected in series to the drains of the first and second transistors.

14. The circuit of claim 13, wherein the control circuit includes a gate voltage setting circuit connected to the first and second transistors and to the current mirror circuit for setting the gate voltages of the first and second transistors.

15. The circuit of claim 14, wherein the gate voltage setting circuit includes a first impedance element connected between the second supply line and the gates of the first and second transistors and a second impedance element connected between the current mirror circuit and the gates of the first and second transistors.

16. The circuit of claim 14, wherein the control circuit includes a current source connected to the current mirror circuit and the gate voltage setting circuit.

17. The circuit of claim 16, wherein the control circuit includes a differential circuit connected to the current source and the drains of the first and second transistors which controls the current source so as to bring the drain voltages of the first and second transistors to a substantial equivalence.

18. A digital-to-analog conversion circuit comprising:
   a voltage dividing circuit including a first impedance element connected to a first supply line, a second impedance element connected to a second supply line, the second impedance element having substantially the same impedance as the first impedance element, and a third impedance element connected between the first and second impedance elements, the third impedance element having a predetermined impedance, wherein the third impedance element includes a plurality of sub-impedance elements for dividing a voltage between the first and second impedance elements to generate a plurality of divided voltages at nodes between the sub-impedance elements;
   a first current source connected to a first node between the first and third impedance elements, and a second current source connected to a second node between the second and third impedance elements, which supply first and second currents having substantially the same value to the first node and the second node, respectively;
   a selecting unit that selects one of the nodes between the sub-impedance elements and outputs the selected node voltage as a selected voltage on the basis of the first and second currents and the impedances of the first through third impedance elements; and
   a first control circuit including a comparing circuit that receives the selected voltage and a predetermined reference voltage and compares the selected voltage with the predetermined reference voltage, the first control circuit controlling, on the basis of the compared result, the first and second currents supplied from the first and second current sources so as to bring the selected voltage to a substantial equivalence with the reference voltage, wherein voltages at the first and second nodes are used for generating an analog voltage signal, the comparing circuit includes a constant current circuit for generating a bias current used in the comparing circuit, and the constant current circuit includes,
   first and second transistors connected in parallel between the first and second supply lines, the gates of the first and second transistors being connected to each other and wherein the first and second transistors have different sizes,
   an output transistor having a gate connected to the gates of the first and second transistors, and
   a second control circuit that controls voltages applied to the gates of the first and second transistors so that drain currents having a substantially same value flow through the first and second transistors, wherein the drain current flows through the output transistor as the bias current.

19. A current generating circuit comprising:
   a first voltage dividing circuit, connected between first and second supply lines, which divides a differential voltage between first and second voltages to generate a first divided voltage;
   a second voltage dividing circuit including a first impedance element connected to the first supply line, a second impedance element connected to the second supply line, the second impedance element having substantially the same impedance as the first impedance element, and a third impedance element connected between the first and second impedance elements, the third impedance element having a predetermined impedance, wherein the third impedance element includes a plurality of sub-impedance elements for generating a plurality of second divided voltages at nodes between the sub-impedance elements;

a first current source connected to a first node between the first and third impedance elements and a second current source connected to a second node between the second and third impedance elements, which supply a first current and a second current having substantially the same value to the first node and the second node, respectively;

a differential circuit that receives the first divided voltage and one of the plurality of the second divided voltages and controls the first and second currents supplied from the first and second current sources so as to bring the first divided voltage to a substantial equivalence with the selected second divided voltage; and a third current source connected to the differential circuit which generates a third current having a value substantially equal to the first and second currents, wherein the third current is an output current of the current generating circuit.

* * * * *

UNITED STATES PATENT AND TRADEMARK OFFICE
CERTIFICATE OF CORRECTION

PATENT NO.: 6,157,335
DATED      : December 5, 2000
INVENTOR(S): Hisao SUZUKI, et al.

It is certified that an error appears in the above-identified patent and that said Letters Patent is hereby corrected as shown below:

The assignee's name should to be changed from "FUJITUS LIMITED" to --FUJITSU LIMITED--.

Signed and Sealed this

Twenty-second Day of May, 2001

Attest:

NICHOLAS P. GODICI

Attesting Officer        Acting Director of the United States Patent and Trademark Office